US010890955B2

(12) United States Patent
Miranda Gavillan et al.

(10) Patent No.: US 10,890,955 B2
(45) Date of Patent: Jan. 12, 2021

(54) SYSTEM FOR CONTROLLING ENVIRONMENTAL CONDITIONS WITHIN AN AUTOMATED DATA STORAGE LIBRARY

(71) Applicant: International Business Machines Corporation, Armonk, NY (US)

(72) Inventors: Jose G. Miranda Gavillan, Tucson, AZ (US); Brian G. Goodman, Tucson, AZ (US); Gregory J. Goodman, Tucson, AZ (US); Kenny Nian Gan Qiu, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 15/460,429

(22) Filed: Mar. 16, 2017

(65) Prior Publication Data
US 2018/0267581 A1 Sep. 20, 2018

(51) Int. Cl.
*G06F 1/20* (2006.01)
*H05K 7/20* (2006.01)

(52) U.S. Cl.
CPC ......... *G06F 1/206* (2013.01); *H05K 7/20709* (2013.01); *H05K 7/20836* (2013.01); *G05B 2219/21156* (2013.01)

(58) Field of Classification Search
CPC ....... G06F 1/20; G06F 1/206; H05K 7/20709; H05K 7/20718; H05K 7/20754; H05K 7/20836
See application file for complete search history.

(56) References Cited

U.S. PATENT DOCUMENTS

| 4,831,476 A | 5/1989 | Branc et al. |
| 4,838,911 A | 6/1989 | Robertson et al. |
| 5,278,708 A | 1/1994 | Apple et al. |
| 5,449,229 A | 9/1995 | Aschenbrenner et al. |
| 5,940,354 A | 8/1999 | Inoue |

(Continued)

FOREIGN PATENT DOCUMENTS

| CN | 102192631 A | 9/2011 |
| CN | 102407663 A | 4/2012 |

(Continued)

OTHER PUBLICATIONS

Hanaoka Y. et al., "Technologies for Realizing New ETERNUS LT270 High-End Tape Library System", Fujitsu Sci. Tech. J., 42.1, pp. 24-31, Jan. 2006.

(Continued)

*Primary Examiner* — Jonathan Bradford
(74) *Attorney, Agent, or Firm* — Scully, Scott, Murphy & Presser, P.C.

(57) ABSTRACT

A system for controlling at least one environmental condition within at least one data storage library. The system may include at least one enclosure surrounding at least a portion of at least one data storage library. The system may also include at least one environmental conditioning unit fluidly connected to the at least one enclosure via at least one duct, wherein the at least one environmental conditioning unit is configured to control at least one environmental condition (e.g., temperature and/or humidity) within the at least one enclosure and within the at least one data storage library.

25 Claims, 15 Drawing Sheets

(56) References Cited

U.S. PATENT DOCUMENTS

| | | |
|---|---|---|
| 6,347,020 B1 | 2/2002 | Carpenter et al. |
| 6,366,982 B1 | 4/2002 | Suzuki et al. |
| 6,409,450 B1 | 6/2002 | Ostwald et al. |
| 6,457,928 B1 | 10/2002 | Ryan |
| 6,467,285 B2 | 10/2002 | Felder et al. |
| 6,478,524 B1 | 11/2002 | Malin |
| 6,494,663 B2 | 12/2002 | Ostwald et al. |
| 6,537,013 B2 | 3/2003 | Emberty et al. |
| 6,563,771 B1 | 5/2003 | Debiez |
| 6,661,596 B2 | 12/2003 | Chliwnyj et al. |
| 6,676,026 B1 | 1/2004 | McKinley et al. |
| 6,676,505 B2 | 1/2004 | Behl |
| 6,854,275 B2 | 2/2005 | Evans |
| 6,896,612 B1 | 5/2005 | Novotny |
| 6,924,981 B2 | 8/2005 | Chu et al. |
| 6,940,716 B1 | 9/2005 | Korinsky et al. |
| 7,039,924 B2 | 5/2006 | Goodman et al. |
| 7,106,538 B2 | 9/2006 | Minemura et al. |
| 7,277,247 B2 | 10/2007 | Hoshino |
| 7,434,412 B1 * | 10/2008 | Miyahira ............... G06F 1/20 |
| | | 165/104.33 |
| 7,474,497 B2 | 1/2009 | Jesionowski et al. |
| 7,635,246 B2 | 12/2009 | Neeper et al. |
| 7,656,602 B2 | 2/2010 | Ben et al. |
| 7,656,660 B2 | 2/2010 | Hoeft et al. |
| 7,746,634 B2 | 6/2010 | Hom et al. |
| 7,751,188 B1 | 7/2010 | French et al. |
| 7,961,419 B2 | 6/2011 | Suzuki et al. |
| 8,051,671 B2 | 11/2011 | Vinson et al. |
| 8,141,621 B2 | 3/2012 | Campbell et al. |
| 8,151,046 B2 | 4/2012 | Suzuki et al. |
| 8,206,976 B2 | 6/2012 | Kobayashi et al. |
| 8,209,993 B2 | 7/2012 | Carlson et al. |
| 8,210,914 B2 | 7/2012 | McMahan et al. |
| 8,456,840 B1 | 6/2013 | Clidaras et al. |
| 8,514,513 B2 | 8/2013 | Hori |
| 8,544,289 B2 | 10/2013 | Johnson et al. |
| 8,675,303 B2 | 3/2014 | Compton et al. |
| 8,694,152 B2 | 4/2014 | Cyrulik et al. |
| 8,789,384 B2 | 7/2014 | Eckberg et al. |
| 8,849,784 B2 | 9/2014 | Alber et al. |
| 8,857,208 B2 | 10/2014 | Malin |
| 8,939,524 B2 | 1/2015 | Gasser |
| 8,974,274 B2 | 3/2015 | Carlson |
| 9,025,275 B1 | 5/2015 | Manes et al. |
| 9,043,035 B2 | 5/2015 | Chainer et al. |
| 9,069,534 B2 | 6/2015 | Rogers |
| 9,110,641 B2 | 8/2015 | Wu |
| 9,155,230 B2 | 10/2015 | Eriksen |
| 9,190,112 B1 | 11/2015 | Bayang et al. |
| 9,240,209 B1 | 1/2016 | Crawford et al. |
| 9,255,936 B2 | 2/2016 | Hunt et al. |
| 9,291,408 B2 | 3/2016 | Iyengar et al. |
| 9,321,136 B2 | 4/2016 | Eckberg et al. |
| 9,361,921 B2 | 6/2016 | Herget |
| 9,368,148 B2 | 6/2016 | Starr et al. |
| 9,433,122 B2 | 8/2016 | Ohba et al. |
| 9,642,286 B1 | 5/2017 | Gutierrez et al. |
| 9,888,615 B2 | 2/2018 | Frink et al. |
| 9,916,869 B1 | 3/2018 | Miranda Gavillan et al. |
| 10,004,165 B1 | 6/2018 | Bailey |
| 10,026,455 B1 | 7/2018 | Miranda Gavillan et al. |
| 10,045,457 B1 | 8/2018 | Miranda Gavillan et al. |
| 2002/0023444 A1 | 2/2002 | Felder et al. |
| 2002/0098064 A1 | 7/2002 | Ostwald et al. |
| 2003/0039056 A1 | 2/2003 | Satoh |
| 2003/0197619 A1 | 10/2003 | Lawrence et al. |
| 2004/0025515 A1 | 2/2004 | Evans |
| 2004/0080244 A1 | 4/2004 | Lowther et al. |
| 2004/0145468 A1 | 7/2004 | La et al. |
| 2004/0153386 A1 | 8/2004 | Eckerdt |
| 2004/0165358 A1 | 8/2004 | Regimbal et al. |
| 2004/0264042 A1 | 12/2004 | Pollard et al. |
| 2005/0057847 A1 | 3/2005 | Armagost et al. |
| 2005/0170770 A1 | 8/2005 | Johnson et al. |
| 2005/0185323 A1 | 8/2005 | Brace et al. |
| 2005/0270727 A1 | 12/2005 | Shih |
| 2006/0177922 A1 | 8/2006 | Shamah et al. |
| 2006/0250578 A1 | 11/2006 | Pohl et al. |
| 2006/0259195 A1 | 11/2006 | Eliuk et al. |
| 2006/0262447 A1 | 11/2006 | Hoshino |
| 2007/0180278 A1 | 8/2007 | Botchek |
| 2007/0250410 A1 | 10/2007 | Brignone et al. |
| 2008/0043371 A1 | 2/2008 | Konshak et al. |
| 2008/0061138 A1 | 3/2008 | Fisher et al. |
| 2008/0065903 A1 | 3/2008 | Goodman et al. |
| 2008/0094797 A1 | 4/2008 | Coglitore et al. |
| 2008/0106368 A1 | 5/2008 | Vitier |
| 2008/0151491 A1 | 6/2008 | Baldwin et al. |
| 2008/0231152 A1 | 9/2008 | Malin |
| 2009/0046427 A1 | 2/2009 | Noteboom et al. |
| 2009/0061758 A1 | 3/2009 | Yeung et al. |
| 2009/0168345 A1 * | 7/2009 | Martini ............... F24F 11/0001 |
| | | 361/691 |
| 2009/0266511 A1 | 10/2009 | Yang |
| 2010/0078492 A1 | 4/2010 | Cislo |
| 2010/0170277 A1 | 7/2010 | Schmitt et al. |
| 2010/0188810 A1 | 7/2010 | Andersen et al. |
| 2010/0249987 A1 | 9/2010 | Hong et al. |
| 2010/0254241 A1 | 10/2010 | Aoki |
| 2011/0022771 A1 | 1/2011 | Foerster |
| 2011/0083824 A1 | 4/2011 | Rogers |
| 2011/0108207 A1 | 5/2011 | Mainers et al. |
| 2011/0231007 A1 | 9/2011 | Biehle et al. |
| 2012/0046792 A1 | 2/2012 | Secor |
| 2012/0155027 A1 | 6/2012 | Broome et al. |
| 2012/0305042 A1 | 12/2012 | Lorbiecki |
| 2013/0031928 A1 | 2/2013 | Kim |
| 2013/0088833 A1 * | 4/2013 | Cox ............... H05K 7/20736 |
| | | 361/689 |
| 2013/0128455 A1 | 5/2013 | Koblenz et al. |
| 2013/0244563 A1 | 9/2013 | Noteboom et al. |
| 2014/0019768 A1 | 1/2014 | Pineau et al. |
| 2014/0059946 A1 | 3/2014 | Gardner et al. |
| 2014/0206271 A1 | 7/2014 | Ignacio |
| 2014/0238639 A1 | 8/2014 | Ambriz et al. |
| 2014/0277765 A1 | 9/2014 | Karimi et al. |
| 2014/0290162 A1 | 10/2014 | Tanimoto |
| 2014/0293471 A1 | 10/2014 | Sakuma |
| 2015/0036293 A1 | 2/2015 | Martini |
| 2015/0086305 A1 | 3/2015 | Ostwald et al. |
| 2015/0088319 A1 | 3/2015 | Dasari et al. |
| 2015/0106654 A1 | 4/2015 | Foster et al. |
| 2015/0167996 A1 | 6/2015 | Fadell et al. |
| 2015/0179210 A1 | 6/2015 | Ostwald et al. |
| 2015/0203297 A1 | 7/2015 | Manning et al. |
| 2015/0269641 A1 | 9/2015 | Roy |
| 2015/0294525 A1 | 10/2015 | Broom et al. |
| 2016/0094898 A1 | 3/2016 | Primm et al. |
| 2016/0107312 A1 | 4/2016 | Morrill et al. |
| 2016/0109389 A1 | 4/2016 | Suzuki et al. |
| 2016/0112245 A1 | 4/2016 | Mankovskii |
| 2016/0117126 A1 | 4/2016 | De Spiegeleer et al. |
| 2016/0223455 A1 * | 8/2016 | Minegishi ............ F24F 11/0008 |
| 2016/0240061 A1 | 8/2016 | Li et al. |
| 2016/0302332 A1 | 10/2016 | Anderson et al. |
| 2017/0010015 A1 | 1/2017 | Jan |
| 2017/0064876 A1 | 3/2017 | Leckelt et al. |
| 2017/0154483 A1 | 6/2017 | Cordiner et al. |
| 2017/0275012 A1 | 9/2017 | Tretow et al. |
| 2017/0323666 A1 | 11/2017 | Jesionowski et al. |
| 2017/0347496 A1 * | 11/2017 | Smith ............... H05K 7/20736 |
| 2018/0077819 A1 | 3/2018 | Roy |
| 2018/0155975 A1 | 6/2018 | Kempfle |
| 2018/0172304 A1 | 6/2018 | Wolfson |
| 2018/0184548 A1 | 6/2018 | Frink et al. |

FOREIGN PATENT DOCUMENTS

| | | |
|---|---|---|
| CN | 102881313 A | 1/2013 |
| CN | 204361533 U | 5/2015 |
| JP | 11-287499 | 10/1999 |
| JP | 2001093121 A | 4/2001 |
| JP | 2001307474 A | 11/2001 |

(56) References Cited

FOREIGN PATENT DOCUMENTS

| JP | 2009087518 | A | 4/2009 |
|----|------------|---|--------|
| JP | 2011191207 | A | 9/2011 |
| WO | 2007099542 | A2 | 9/2007 |
| WO | 2008014578 | A1 | 2/2008 |
| WO | 2009134610 | A2 | 11/2009 |
| WO | 2010067443 | A1 | 6/2010 |

OTHER PUBLICATIONS

McCormick-Goodhart M. et al, "The Design and Operation of a Passive Humidity-Controlled Cold Storage Vault Using Conventional Freezer Technology and Moisture-Sealed Cabinets", IS&T's 2004 Archiving Conference, Apr. 20-23, 2005, San Antonio, Texas.
Frachtenberg E. et al., "Thermal Design in the Open Compute Datacenter", Thermal and Thermomechanical Phenomena in Electronic Systems (ITherm), 13th IEEE I22012.
Oga, S. et al., "Indirect External Air Cooling Type Energy-Saving Hybrid Air Conditioner for Data Centers, "F-COOL NEO"", Fuji Electric Review, vol. 60, No. 1, Mar. 30, 2014, pp. 59-64.
Lee, S. et al., "Thermoelectric-based Sustainable Self-Cooling for Fine-Grained Processor Hot Spots", 15th IEEE ITHERM Conference, May 31-Jun. 3, 2016, pp. 847-856.
Disclosed Anonymously, ip.com, "Method for a Direct Air Free Cooling with a real time hygrometry regulation for Data Center", IPCOM000200312D, Oct. 5, 2010, pp. 1-3.
Rasmussen N., "Cooling Options for Rack Equipment with Side-to-Side Airflow", www.apc.com, 2004.
Ouchi M. et al., "Thermal Management Systems for Data Centers with Liquid Cooling Technique of CPU", ITherm IEEE 13th Intersociety Conference, May 30-Jun. 1, 2012, pp. 790-798.
Authors: IBM, "Energy Efficient Cooling System for Data Center", IPCOM000182040D, Apr. 23, 2009, pp. 1-4.
Ernest S. Gale et al., U.S. Appl. No. 15/460,389, filed Mar. 16, 2017.
Ernest S. Gale et al., U.S. Appl. No. 15/460,397, filed Mar. 16, 2017.
Ernest S. Gale et al., U.S. Appl. No. 15/460,403, filed Mar. 16, 2017.
Ernest S. Gale et al., U.S. Appl. No. 15/460,420, filed Mar. 16, 2017.
Jose G. Miranda Gavillan et al., U.S. Appl. No. 15/460,345, filed Mar. 16, 2017.
Jose G. Miranda Gavillan et al., U.S. Appl. No. 15/460,357, filed Mar. 16, 2017.
Jose G. Miranda Gavillan et al., U.S. Appl. No. 15/460,379, filed Mar. 16, 2017.
Jose G. Miranda Gavillan et al., U.S. Appl. No. 15/460,402, filed Mar. 16, 2017.
Jose G. Miranda Gavillan et al., U.S. Appl. No. 15/460,423, filed Mar. 16, 2017.
Jose G. Miranda Gavillan et al., U.S. Appl. No. 15/460,441, filed Mar. 16, 2017.
Jose G. Miranda Gavillan et al., U.S. Appl. No. 15/460,456, filed Mar. 16, 2017.
Jose G. Miranda Gavillan et al., U.S. Appl. No. 15/460,472, filed Mar. 16, 2017.
Jose G. Miranda Gavillan et al., U.S. Appl. No. 15/460,479, filed Mar. 16, 2017.
Jose G. Miranda Gavillan et al., U.S. Appl. No. 15/460,429, filed Mar. 16, 2017.
Jose G. Miranda Gavillan et al., U.S. Appl. No. 15/460,439, filed Mar. 16, 2017.
Ernest S. Gale et al., U.S. Appl. No. 15/460,497, filed Mar. 16, 2017.
List of IBM Patents or Applications Treated as Related.
Office Action dated Mar. 25, 2019 issued in U.S. Appl. No. 15/979,601.
Ex Parte Quayle Action dated May 1, 2019 issued in U.S. Appl. No. 15/460,497.
Office Action dated May 9, 2019 issued in U.S. Appl. No. 15/460,456.
Office Action dated Apr. 25, 2019 issued in U.S. Appl. No. 15/460,439.

* cited by examiner

SYSTEM FOR CONTROLLING ENVIRONMENTAL CONDITIONS WITHIN AN AUTOMATED DATA STORAGE LIBRARY

BACKGROUND

The present disclosure relates to a data storage library for the storage and data transfer of data storage media, and more specifically, to a system for controlling the environmental conditions within a data storage library.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as PROM, EEPROM, flash PROM, COMPACTFLASH™, SMARTMEDIA™, MEMORY STICK™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more robotic accessors. Such accessors have grippers for physically retrieving the selected data storage cartridges from the storage slots within the automated data storage library and transporting such cartridges to the data storage drives by moving, for example, in the horizontal (X) and vertical (Y) directions.

In an effort to increase storage capacity, deep slot technology allows for storage cells that contain more than a single data storage cartridge. Such storage libraries allow for higher density, or more cartridges stored per square foot. In "deep slot" libraries, two or more cartridges may be stored in a multi-cartridge deep slot cell, arrayed in series, one behind the other, in tiers ranging from a front-most tier to a rearmost tier.

Efforts to improve the performance of traditional data centers attempt to minimize the cost of processing and storing data. One option that is employed to reduce operational costs of datacenters is to run the equipment in the datacenter at the high end of its environmental operational limits, thereby allowing for cooling of the datacenter to be reduced. In other words, datacenters are running increasingly hot and more humid conditions than traditional datacenters in an attempt to reduce operating costs. Although this strategy may be effective when applied to disk and/or flash data storage environments, magnetic tape is more susceptible to degradation when exposed to these unfavorable conditions. Therefore, this option is not available for magnetic tape libraries.

In an effort to control the environment within data storage libraries so as to provide suitable working conditions for magnetic tape media, data storage drives, etc., environmental conditioning units may be incorporated into (or on) the data storage libraries themselves. However, some data storage libraries may be too small to incorporate an integrated environmental conditioning unit and/or may not be large enough to justify an integrated environmental conditioning unit. Furthermore, incorporation of an environmental conditioning unit also may involve significant engineering and/or alterations to the data storage library in order to properly mount the environmental conditioning unit, substantially seal the data storage library, drain condensation produced by the environmental conditioning unit, etc.

SUMMARY

In accordance with an aspect of the disclosure, a system for controlling at least one environmental condition within a data storage library is disclosed. The system includes a data storage library and at least one enclosure surrounding at least a portion of the data storage library. The system also includes at least one environmental conditioning unit fluidly connected to the at least one enclosure via at least one duct, wherein the at least one environmental conditioning unit is configurable to control at least one environmental condition within the at least one enclosure and within the data storage library.

The at least one enclosure may be formed of at least one flexible material, the at least one flexible material selected from the group consisting of nylon, polyester, canvas, cotton, silk, plastic, foil, para-aramid synthetic fiber, and combinations thereof. Alternatively and/or additionally, the at least one enclosure may be formed of at least one rigid material, the at least one rigid material selected from the group consisting of wood, plastic, carbon fiber, metal, and combinations thereof.

The at least one enclosure further may include at least one access opening to permit access to the interior of the at least one enclosure. The at least one access opening may have an access door to impede intrusion of exterior environmental conditions and escape of interior environmental conditions. Furthermore, the at least one enclosure may enclose the entire data storage library. Alternatively, the at least one enclosure may enclose only one side of the library which includes the at least one access opening of the data storage library.

In accordance with another aspect of the disclosure, a device is disclosed, the device including an enclosure configured to at least partially surround at least a portion of a data storage library. The enclosure may include at least one surface configured to surround the at least one opening in the data storage library, and at least one enclosure access door in the at least one of the surface of sufficient size to permit access to at least a portion of the data storage library. The enclosure may also include at least one duct connection configured to fluidly connect at least one duct from an environmental conditioning unit to the enclosure.

The enclosure may be formed of at least one flexible material, the at least one flexible material selected from the group consisting of nylon, polyester, canvas, cotton, silk, plastic, foil, para-aramid synthetic fiber, and combinations thereof. Additionally, the enclosure may further include a collapsible frame structure. Alternatively, the enclosure may be formed of at least one rigid material selected from the group consisting of wood, plastic, carbon fiber, metal, and combinations thereof.

The enclosure may further include at least one environmental sensor for measuring at least one of temperature, humidity, and combinations thereof. Additionally and/or alternatively, the at least one enclosure access door may comprise at least one of a hinged door, split membrane, sliding panel, rolled door, hinged flap, a zippered door, vertically-hanging slats, an air curtain, and vertically-hanging flaps.

According to another aspect of the disclosure, a system is disclosed which includes at least one data storage library having at least one ventilation opening therein, and at least one enclosure configurable to surround the data storage library, the at least one enclosure configured to form a chamber of sufficient size to contain the data storage library. The system also includes at least one environmental conditioning unit fluidly connected to the at least one enclosure, wherein the at least one environmental conditioning unit is configured to control one or more environmental conditions within the data storage library.

The at least one environmental conditioning unit may be fluidly connected to the at least one enclosure by at least one supply duct. Furthermore, the system may include a plurality of data storage libraries respectively surrounded by a plurality of enclosures, wherein a single environmental conditioning unit is configured to be fluidly connected to the plurality of enclosures. At least one of a Y-duct and a manifold may fluidly connect the single environmental conditioning unit to the plurality of enclosures.

In accordance with another aspect of the disclosure, a system for controlling at least one environmental condition within at least one data storage library is disclosed. The system may include a data storage library, wherein the data storage library comprises a housing having at least a first ventilation opening in a first surface thereon. The system may also include a first enclosure configured to surround at least the first ventilation opening on the first surface of the data storage library, as well as at least one environmental conditioning unit configured to control at least one environmental condition within the data storage library, wherein the at least one environmental conditioning unit is fluidly connected to the first enclosure by at least one supply duct.

The housing may further include at least a second ventilation opening in a second surface thereon, and the system may include a second enclosure configured to surround at least the second ventilation opening in the second surface of the data storage library, wherein the at least one environmental conditioning unit is fluidly connected to the second enclosure by at least one return duct. Additionally, the first enclosure may be configured to surround only the first ventilation opening and the second enclosure may be configured to surround only the second ventilation opening.

DETAILED DESCRIPTION

The following description is made for the purpose of illustrating the general principles of the present disclosure and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Figure 1:
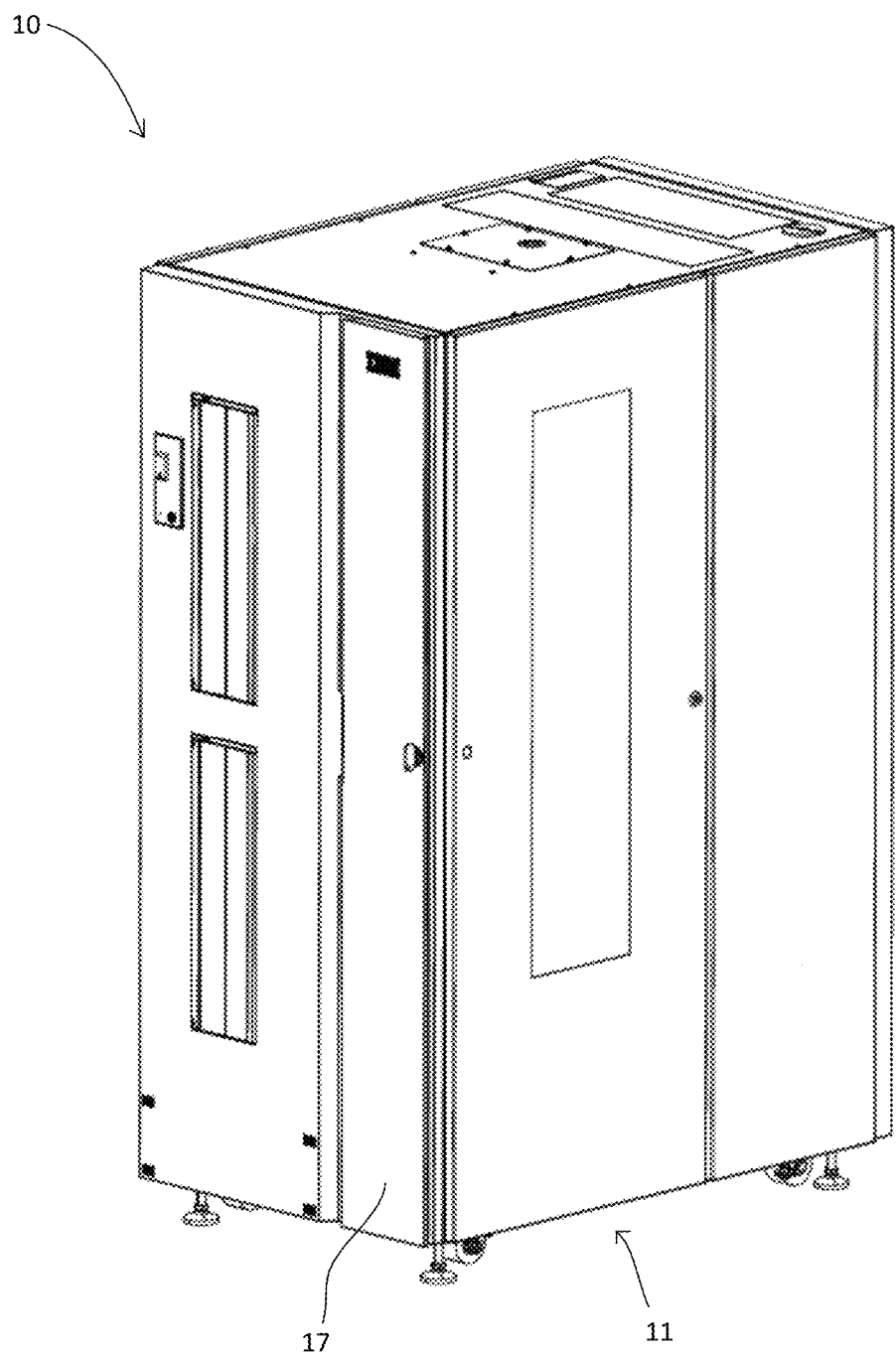
FIG. 1 is a perspective view of an automated data storage library according to one embodiment.
Figure 2:
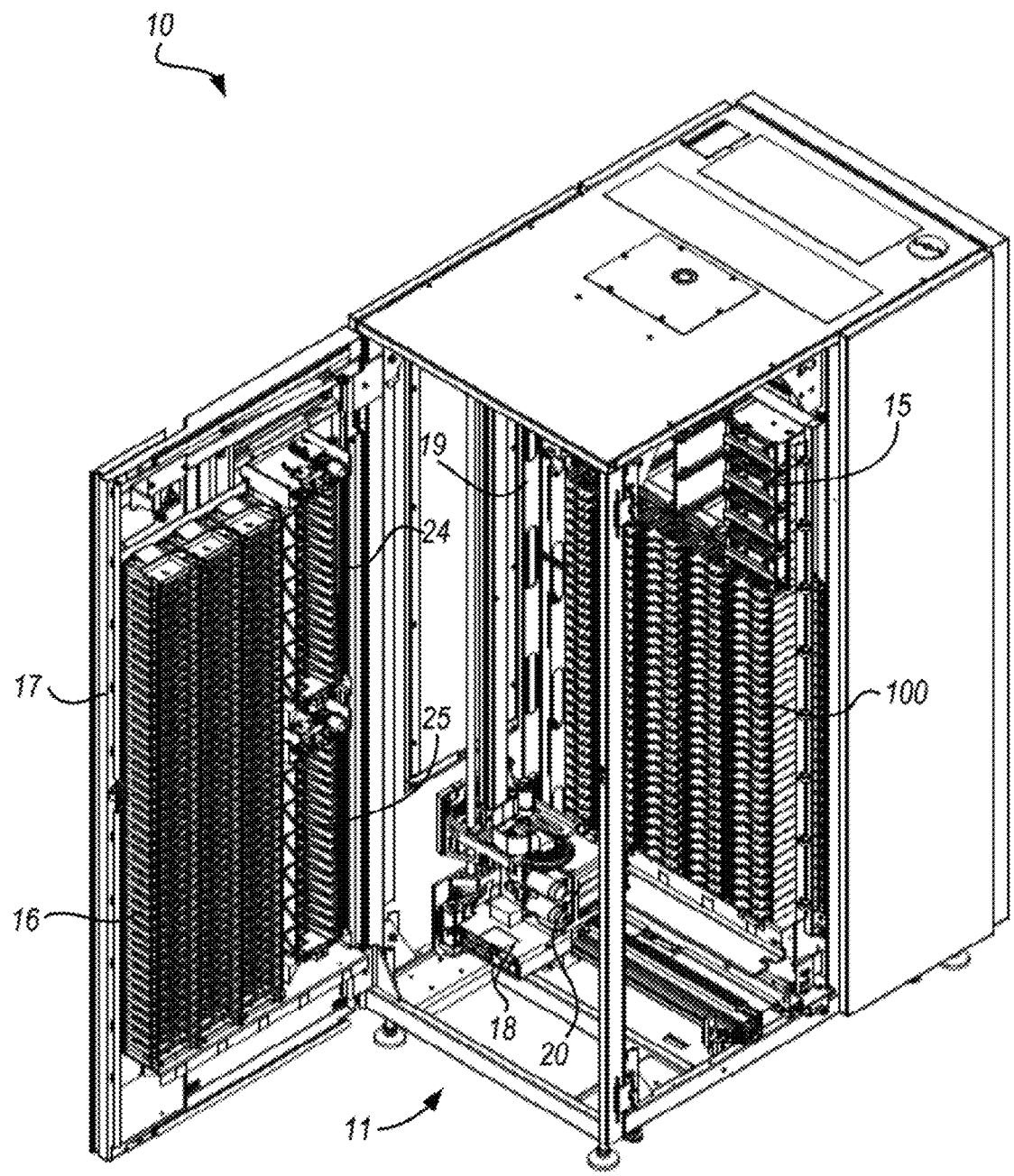
FIG. 2 is a perspective view of the interior of a storage frame from the data storage library of FIG. 1.
Figure 3:
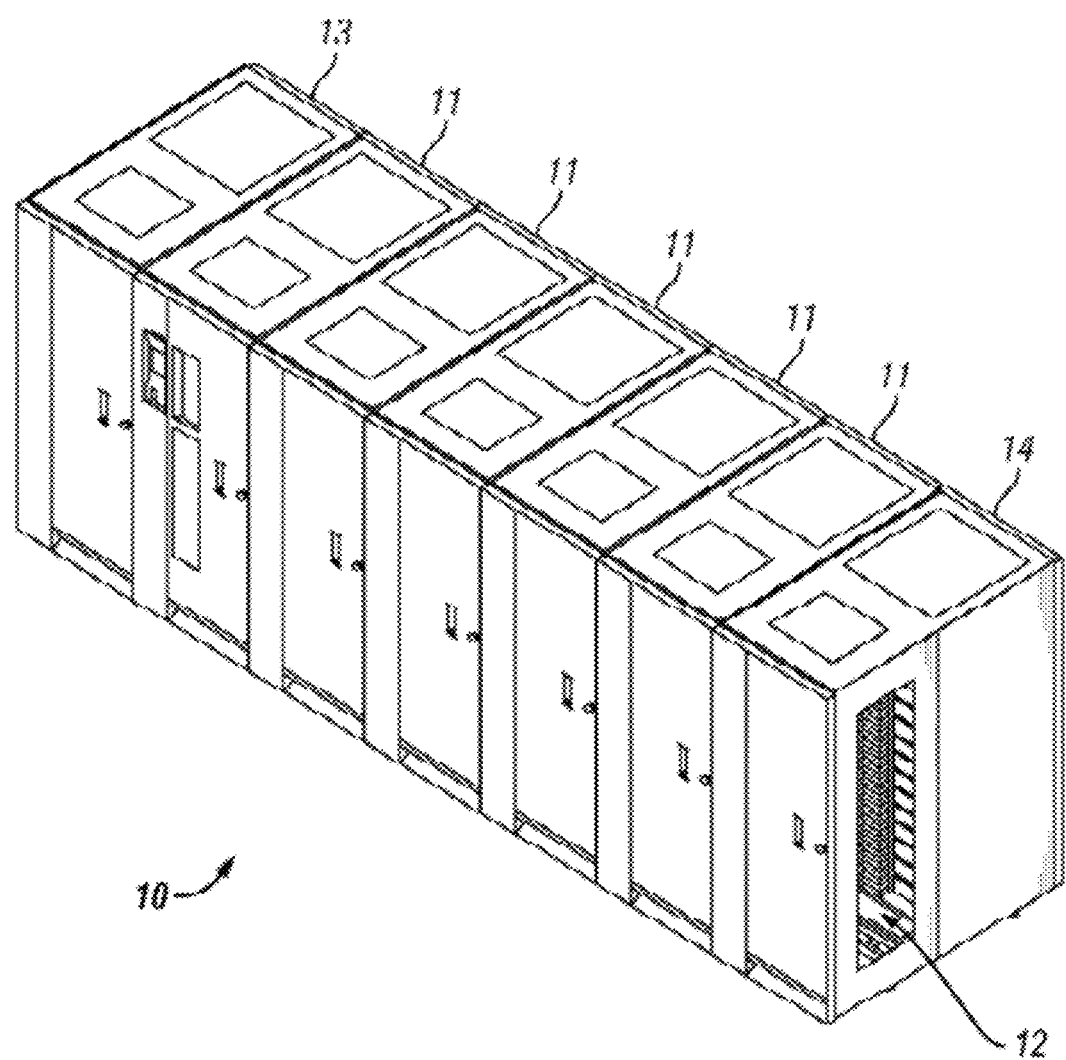
FIG. 3 is a perspective view of an automated data storage library according to another embodiment.

FIGS. 1-3 illustrate an example of a data storage system, e.g., an automated data storage library 10 which stores and retrieves data storage cartridges, containing data storage media (not shown), from multi-cartridge deep slot storage cells 100 and single cartridge storage slots 16. Examples of an automated data storage library which has a similar configuration as that depicted in FIGS. 1-3, and may be implemented with some of the various approaches herein may include IBM TS4500 Library or the IBM 3584 Ultra-Scalable Tape Library. The library 10 may comprise a single frame 11 (as shown in FIGS. 1-2) or multiple frames (as shown in FIG. 3).

The library 10 in the embodiment of FIG. 3 comprises a left hand service bay 13, one or more storage frames 11, and right hand service bay 14. A frame may comprise an expansion component of the library. Thus, storage frames may be added or removed to expand or reduce the size and/or functionality of the library. According to different approaches, frames may include additional storage slots, deep storage slot cells, drives, import/export stations, accessors, operator panels, controller cards, communication cards, power supplies, etc. Moreover, an accessor aisle 12 preferably extends between the storage frames and bays of the embodiment in FIG. 3, thereby allowing an accessor to move between frames.

FIGS. 1-2 show an exemplary embodiment of a storage frame 11, which may act as the base frame of the library 10. The storage frame 11 illustrated in FIG. 2 may have only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front door 17 and a plurality of multi-cartridge deep slot cells 100 on rear wall 19, both of which may be used for storing data storage cartridges that may contain data storage media. According to one approach, the storage slots 16 are configured to store a single data storage cartridge, and the multi-cartridge deep slot cells 100 are configured to store a plurality of data storage cartridges. The arrangement and positioning of the storage slots 16 and the deep slot cells 100 may be different than illustrated in FIG. 2.

With continued reference to FIG. 2, the storage frame 11 of the library 10 also includes at least one data storage drive 15, e.g., for reading and/or writing data with respect to the data storage media in the data storage cartridges. Additionally, a first accessor 18 may be used to transport data storage cartridges containing data storage media between the plurality of storage slots 16, the multi-cartridge deep slot cells 100, and/or the data storage drive(s) 15. According to various approaches, the data storage drives 15 may be optical disk drives, magnetic tape drives, or other types of data storage drives that are used to read and/or write data with respect to the data storage media.

As illustrated, the storage frame 11 may optionally include an operator panel or other user interface, such as a web-based interface, which allows a user to interact with the library 10. Optionally, the library 10 may have an associated software application having a user interface, which also allows a user to interact with the library 10. The software application may be executable on a computing device, a remote server, a cloud or a mobile device.

Figure 4:
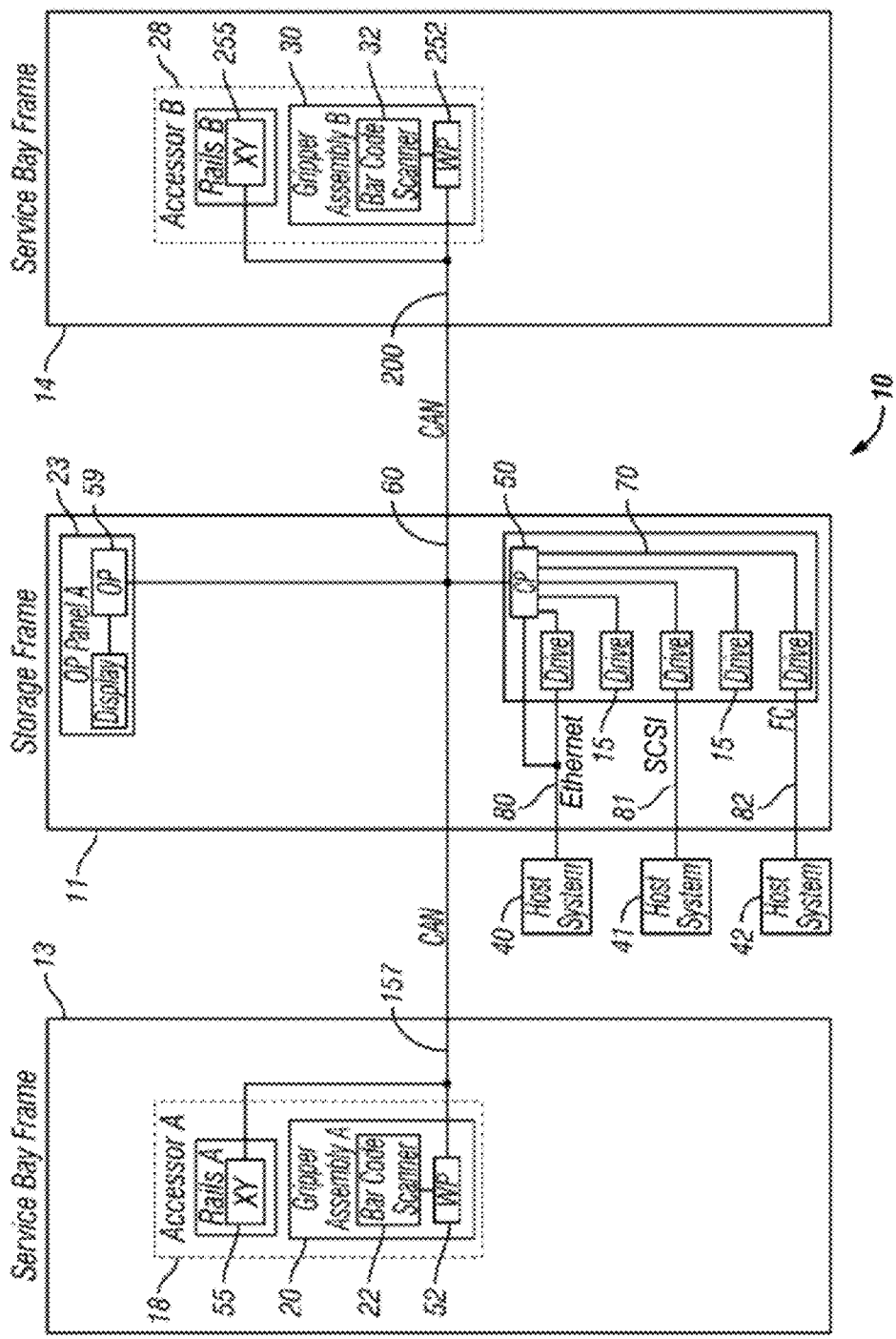
FIG. 4 is a schematic diagram of an automated data storage library according to one embodiment.

Referring now to FIG. 4, the automated data storage library 10 as described in reference to FIGS. 1-3, is depicted according to one embodiment. According to a preferred approach, the library 10 may employ a controller, e.g., arranged as a distributed system of modules with a plurality of processor nodes.

In one approach, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements of the accessor, gripper, controllers, and other components, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

With continued reference to FIG. 4, library 10 receives commands from one or more host systems 40, 41, 42. The host systems 40, 41, 42, such as host servers, communicate with the library directly, e.g., on line 80 (e.g., path), through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16, the deep slot cells 100, and the data storage drives 15. The commands are typically logical commands identifying the data storage cartridges or data storage cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessors 18, 28 and/or gripper assemblies 20, 30. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

As illustrated in FIG. 4, the communication processor node 50 is coupled to each of the data storage drives 15 of a storage frame 11, via lines 70, and may communicate with the drives 15 and with host systems 40, 41, 42. Alternatively, the host systems 40, 41, 42 may be directly coupled to the communication processor node 50, at line 80 (e.g., input) for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 4, lines 80 and 81 are intended to be Ethernet and a SCSI bus, respectively, and may serve as host connections. However, path 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as Ethernet, or a serial connection, such as RS-422. Thus, the data storage drives 15 may be individually coupled to the communication processor node 50 by lines 70. Alternatively, the data storage drives 15 may be coupled to the communication processor node 50 through one or more networks.

Furthermore, additional storage frames 11 may be provided, whereby each is preferably coupled to the adjacent storage frame. According to various approaches, any of the additional storage frames 11 may include communication processor nodes 50, storage slots 16, storage cells 100, data storage drives 15, networks 60, etc.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 5:
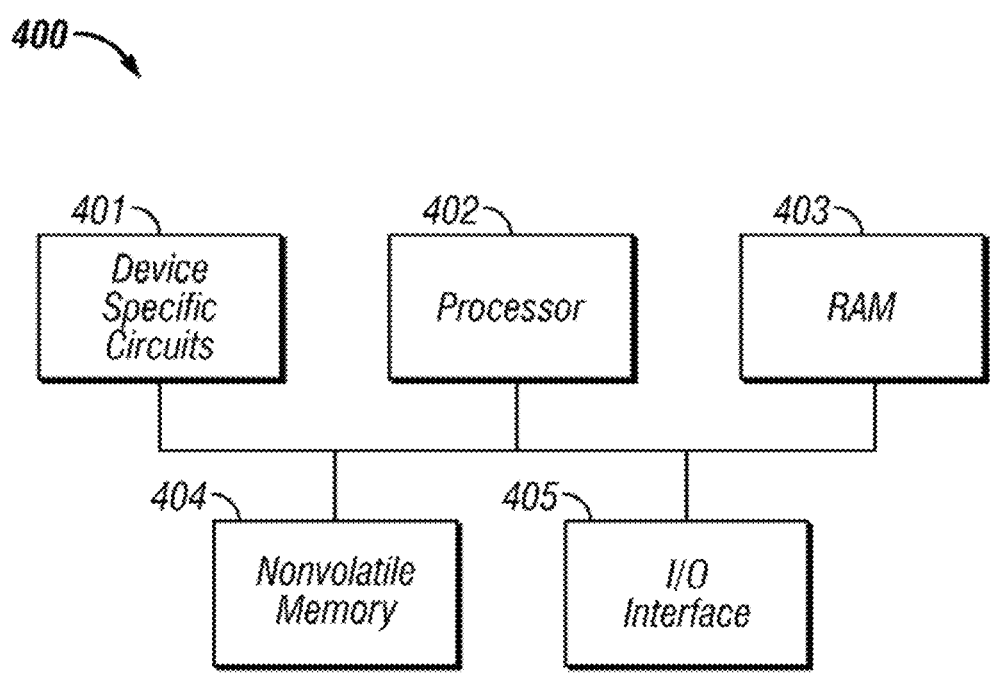
FIG. 5 is a block diagram depicting a controller configuration according to one embodiment.

Referring now to FIG. 5, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data containing programming instructions that can be executed to cause the processor 402 to perform certain functions.

In some embodiments, the I/O interface 405 may include a communication interface that allows the processor 402 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The controller 400 may communicate with an external device via the communication interface 405 in any communication protocols such as Automation/Drive Interface (ADI).

The device specific circuits 401 provide additional hardware to enable the controller 400 to perform unique functions including, but not limited to, motor control of an accessor cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 4) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers, or multiple cores in a processor chip.

As noted above, efforts have previously been made to minimize the cost of processing and storing data in traditional data centers, particularly with respect to the environmental conditions within the data center. For example, equipment within data centers has been run at the upper end of its environmental operational limits in order to reduce the temperature and/or humidity regulation costs throughout the data center. However, operating at or near such operational limits may not be desirable in magnetic tape libraries, as magnetic tape (and/or other data storage library components) may be more susceptible to degradation at such extremes. Furthermore, environmentally controlling the entire data center in which the data storage libraries are housed may be cost prohibitive and/or difficult to maintain over time. Also, while providing each data storage library with an integrated environmental conditioning unit is an option in certain situations, some data storage libraries may be too small to incorporate an integrated environmental conditioning unit and/or may not be large enough to justify an integrated environmental conditioning unit. Furthermore, incorporation of an environmental conditioning unit also may involve significant engineering and/or alterations to the data storage library in order to properly mount the environmental conditioning unit, substantially seal the data storage library, drain condensation produced by the environmental conditioning unit, etc.

Thus, in accordance with aspects of the disclosure, an apparatus, for example an enclosure, is provided that may be configured, arranged, and transformable to at least partially surround a data storage library. The enclosure may be fluidly connected to an associated environmental conditioning unit (e.g., an air conditioning unit), which may deliver conditioned air into the enclosure and, by extension, into the data storage library. In this way, the environmental conditions within the interior of the data storage library may be controlled without the need for an integrated environmental conditioning unit attached thereto.

Figure 6:
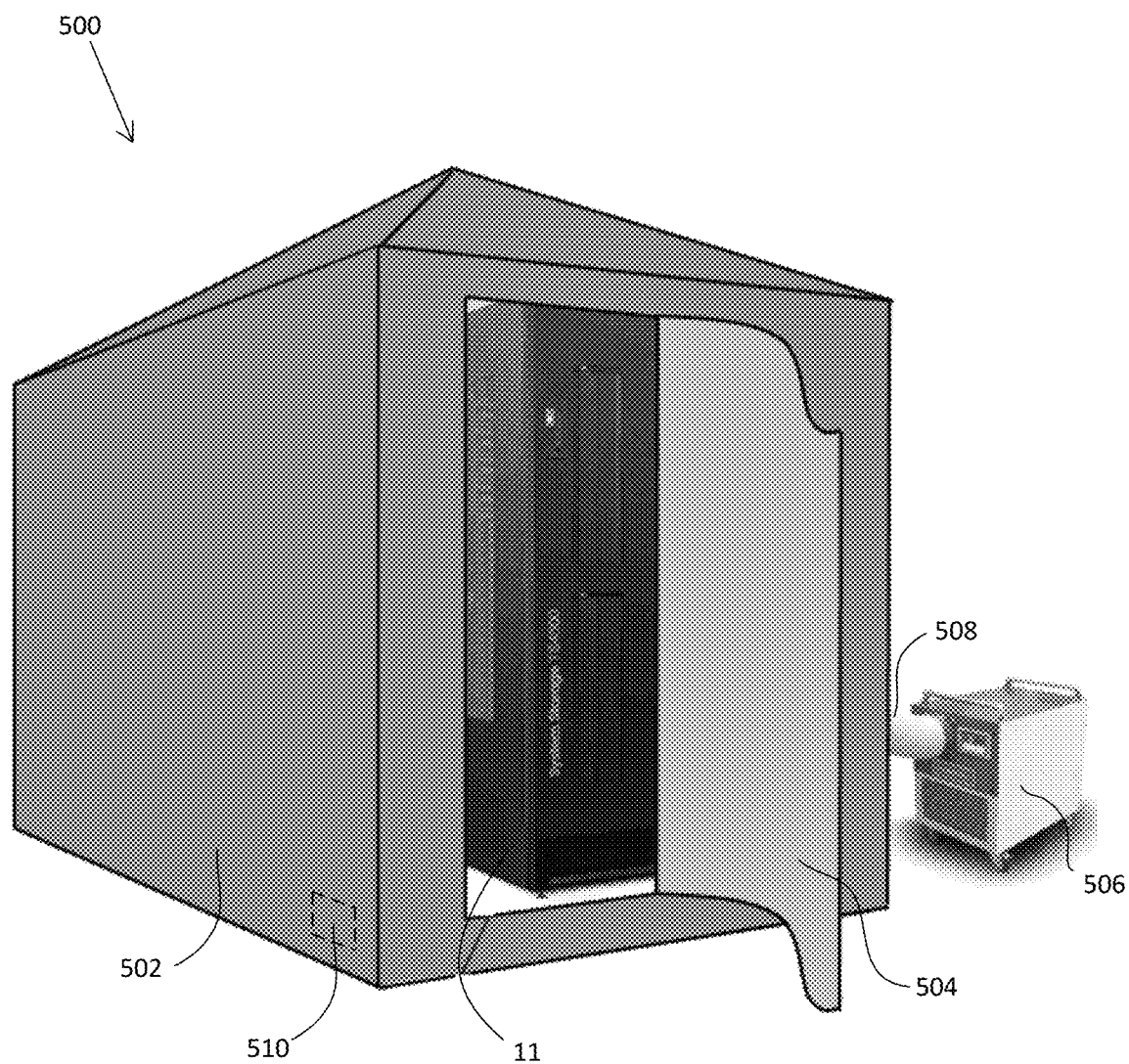
FIG. 6 is a perspective view of an environmental conditioning system for a data storage library in accordance with one aspect.

Referring to FIG. 6, an environmental conditioning system 500 in accordance with an aspect of the present disclosure is illustrated. Environmental conditioning system 500 comprises an enclosure 502 configured to substantially surround a data storage library frame 11, similar to that described above with respect to FIGS. 1-2. While FIG. 6 only shows library frame 11 comprising a single library frame, it is to be understood that a plurality of library frames, such as that which is illustrated in FIG. 3, may be at least partially surrounded by enclosure 502. Library frame(s) 11 may comprise conventional data storage library components, similar to that which is found in library 10 described above with respect to FIG. 2. For instance, one or more of library frames 11 may comprise a plurality of storage slots to hold data storage cartridges associated with data storage media, one or more data storage drives to read and/or write data associated with the media associated with the data storage cartridges, and one or more robotic accessors.

As shown in FIG. 6, enclosure 502 may have a tent-like structure, with the capability of being easily and quickly erected and/or installed (and/or uninstalled and/or disassembled) to substantially surround one or more library frames 11. The walls of enclosure 502 may be self-supporting, or may be held by a collapsible and/or removable framework structure (not shown). The framework structure may be formed of any appropriate material, such as, for example, a plurality of fiberglass or para-aramid synthetic fiber (e.g., KEVLAR®) poles. The framework structure may be broken down and/or collapsed so as to enable the enclosure 502 to be portable and storable when not in use. Additionally, the framework structure may comprise a plurality of spring-biased joints and/or flexible structures, enabling the structure to partially or fully automatically erect when opened or released. While shown surrounding library frame(s) 11 in FIG. 6, it is to be understood that enclosure 502 may be erected alone and may not require the presence of one or more library frames 11 in order to maintain shape and form. Alternatively, enclosure 502 may use elements of frames 11 for support or attachment points.

Enclosure 502 may be formed of any suitable material, such as nylon, polyester, canvas, cotton, silk, plastic, foil, a para-aramid synthetic fiber (e.g., KEVLAR®), or any other flexible material. The material preferably provides a barrier to environmental conditions. In one embodiment, the enclosure resists, inhibits, and/or prevents environmental conditions outside the enclosure from intruding and/or infiltrating into the interior chamber formed by the enclosure. The enclosure 502 in one embodiment may provide and/or maintain substantially stable environmental conditions within the enclosure 502. Additionally and/or alternatively, enclosure 502 may comprise multiple layers of multiple materials, either alike or different, so as to provide varying degrees of insulating properties, if needed. One or more layers of material of enclosure 502 may be an insulation layer. Furthermore, at least a portion of enclosure 502 may be formed of a substantially water-resistant or waterproof material.

At least one closable access door 504 may be provided on at least one side wall of enclosure 502 so as to allow access by an operator into the interior chamber formed by enclosure 502. Access door 504 may be made of the any suitable material or combination of materials, and they may be the same or different materials than enclosure 502, such as, for example, nylon, polyester, canvas, cotton, silk, plastic, foil, a para-aramid synthetic fiber (e.g., KEVLAR®), or any other flexible material. In one embodiment, the access door 504 may be selectively openable and closable. When open, access door 504 provides an opening preferably of sufficient size to permit a technician (human adult) access to the interior chamber of the enclosure 502. Furthermore, access door 504 may be configured as a hinged flap, a zippered door, one or more vertically-hanging slats or flaps, an air curtain, or any other appropriate closure capable of allowing selective access, yet allowing closure in order to provide a barrier between the environment within enclosure 502 and the environment outside the enclosure 502.

When access door 504 is closed, enclosure 502 may form a chamber having environmental conditions around library frame(s) 11 that may be substantially separate from and different than the environmental conditions outside the enclosure 502. An environmental conditioning unit 506, located outside of and separate from enclosure 502, may be fluidly connected to the enclosure 502 via at least one duct 508. Herein, duct may refer to any material, apparatus or structure that allows air to be moved from one location to another. The environmental conditioning unit 506 may operate to provide conditioned air into the interior of the enclosure 502, thereby controlling at least one environmental condition (e.g., temperature and/or humidity) within the enclosure 502. The environmental conditioning unit 506 may be any suitable mechanism to condition the air, which may comprise cooling, heating, removing humidity, adding humidity, filtering, or any other modification to the ambient air.

Additionally, one or more environmental sensors 510 may be located within enclosure 502 such that the controller of the environmental conditioning unit 506 (or another control system, such as library controller 400) may maintain one or more set environmental conditions within enclosure 502. The environmental sensor(s) 510 may be, for example, temperature and/or humidity sensors. Additionally, while not shown, library frame(s) 11 may also incorporate one or more environmental sensors therein for the same purpose as that described above. The environmental sensor(s) 510 may communicate with the environmental conditioning unit 506 or other controller via any suitable connection means, such as a wired connection or wireless connection. Also, while shown as being located on an interior wall of enclosure 502, it is to be understood that environmental sensor(s) 510 may be provided at any suitable location(s) within enclosure 502 (which may also comprise a location within frame 11).

Environmental conditioning unit 506 may be configured to provide conditioned air into enclosure 502 via duct 508 so as to condition the environment within the interior of library frame(s) 11, as well. In one aspect, one or more fans within frame(s) 11 conventionally utilized for tape drives, power supplies, library controllers, etc. may aid in maintaining air circulation within both frame(s) 11 and enclosure 502. Vents and/or natural openings within frame(s) 11 may be configured to allow the conditioned air from within enclosure 502 to enter the interior of the frame(s) 11.

As shown in FIG. 6, only one supply duct 508 leads from environmental conditioning unit 506 to enclosure 502, with no separate return path for the conditioned air being provided. Thus, positive air pressure would result within enclosure 502 when environmental conditioning unit 506 is active, forcing conditioned air into enclosure 502 and out of any existing gaps, cracks, openings, vents, etc. in enclosure 502. Due to such positive pressure, the opening of access door 504 by a technician or other personnel will likely result in conditioned air being forced out of the enclosure 502, as opposed to ambient, external air rushing into the enclosure 502. In this way, the conditioned environment within enclosure 502 (and library frame(s) 11) may be capable of being maintained, thereby inhibiting, avoiding, and/or preventing the influx of external air into library frame(s) 11, where such external air could potentially create issues such as condensation formation on data storage cartridges, data storage drives, or other components.

Alternatively, in addition to supply duct 508, environmental conditioning unit 506 may also include one or more return air ducts capable of recycling the air within enclosure 502. Incorporation of one or more return air ducts may aid in reducing the amount of energy needed to maintain the environmental conditions within enclosure 502, and it may also allow for better control of the environmental conditions within enclosure 502. However, the presence of one or more return ducts may provide less positive air pressure within enclosure 502, which may lead to an influx of external air into the enclosure 502 and/or library frame(s) 11 in the event that access door 504 is opened.

While shown in FIG. 6 as surrounding library frame(s) 11, it is to be understood that enclosure 502 may surround or encompass only certain areas of library frame(s) 11 where air is capable of flowing into or out of the frame(s) 11. For example, the enclosure may only cover an area of the frame(s) 11 where fans are configured to draw air into the interior of the data storage library. In another example, a first enclosure may cover an area of the frame(s) 11 where fans are configured to draw air into the interior of the data storage library, while another enclosure may be configured to cover an area of the frame(s) 11 where vents are located to allow air to pass out of the data storage library. In such an example, the supply duct of the environmental conditioning unit may be fluidly connected to the first enclosure, while a return air duct may be fluidly connected to the second enclosure.

Figure 7:
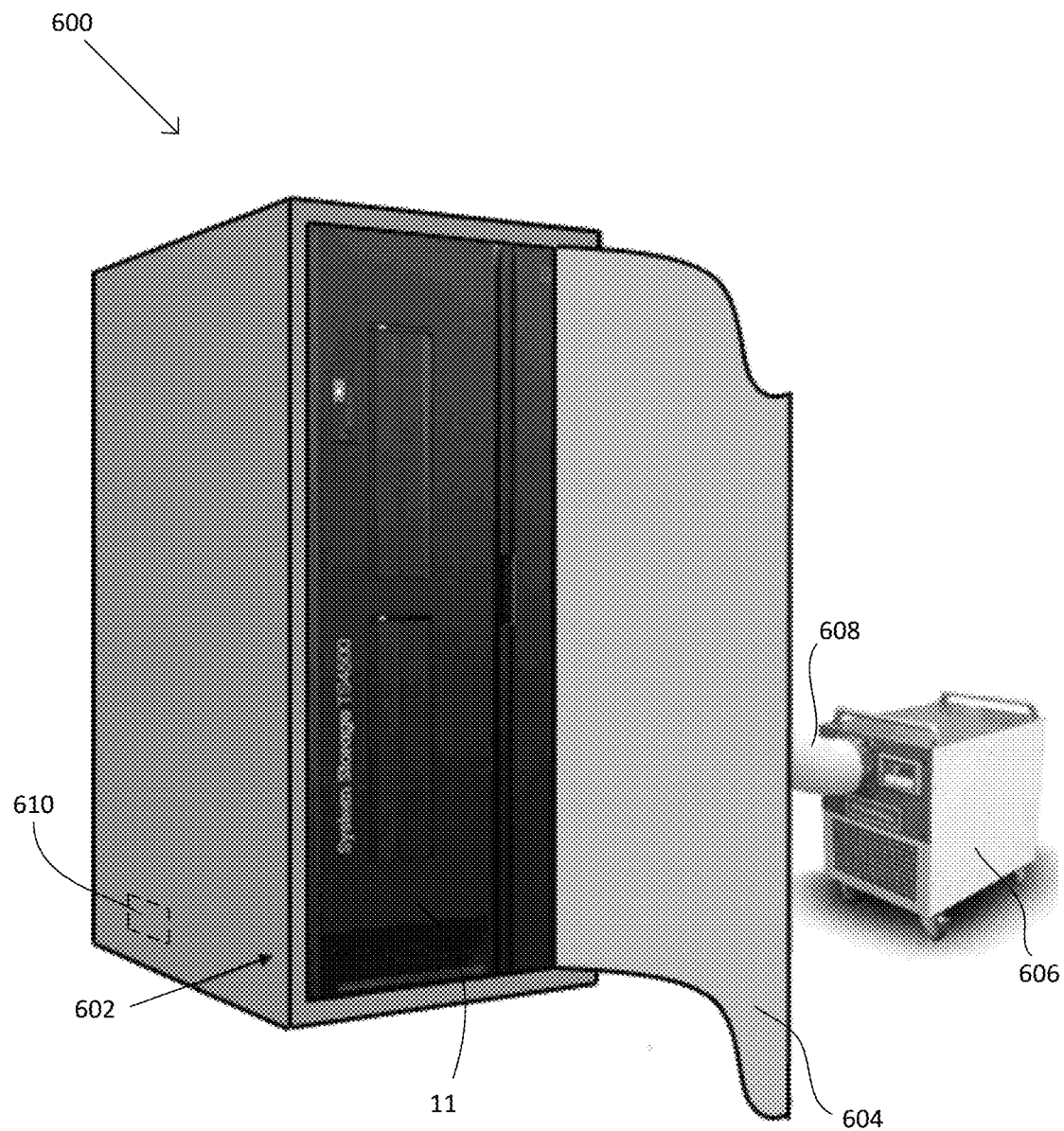
FIG. 7 is a perspective view of an environmental conditioning system for a data storage library in accordance with another aspect.

Referring now to FIG. 7, an environmental conditioning system 600 in accordance with another aspect of the present disclosure is illustrated. Environmental conditioning system 600 comprises an enclosure 602 configured to substantially surround a data storage library frame 11, similar to that described above with respect to FIGS. 1-2. While FIG. 7 only shows library frame 11 comprising a single library frame, it is to be understood that a plurality of library frames, such as that which is illustrated in FIG. 3, may be at least partially surrounded by enclosure 602. Library frame(s) 11 may comprise conventional data storage library componentry, similar to that which is found in library 10 described above with respect to FIG. 2. For instance, one or more of library frames 11 may comprise a plurality of storage slots to hold data storage cartridges associated with data storage media, one or more data storage drives to read and/or write data associated with the media associated with the data storage cartridges, and one or more robotic accessors.

Unlike enclosure 502 described above with respect to FIG. 6, enclosure 602 is configured to fit closely to the surfaces of library frame(s) 11 in a sleeve-like fashion. Thus, enclosure 602 may not necessitate additional structural support to remain in place surrounding frame(s) 11. Enclosure 602 may be formed of any suitable material, such as nylon, polyester, canvas, cotton, silk, plastic, foil, a para-aramid synthetic fiber (e.g., KEVLAR®), or any other flexible material. The material preferably provides a barrier to environmental conditions. In one embodiment, the enclosure resists, inhibits, and/or prevents environmental conditions outside the enclosure from intruding and/or infiltrating into the interior chamber formed by the enclosure. The enclosure 602 in one embodiment may provide and maintain substantially stable environmental conditions within the enclosure 602. Additionally, and/or alternatively, enclosure 602 may comprise multiple layers of multiple materials, either alike or different, so as to provide varying degrees of insulating properties, if needed. One or more layers of material of enclosure 602 may be an insulation layer. Furthermore, at least a portion of enclosure 602 may be formed of a substantially water-resistant or waterproof material.

At least one closable access door 604 may be provided on at least one side wall of enclosure 602 so as to allow access by an operator into the interior chamber formed by enclosure 602. Access door 604 may be made of the any suitable material or combination of materials, and they may be the same or different materials than enclosure 602, such as, for example, such as nylon, polyester, canvas, cotton, silk, plastic, foil, a para-aramid synthetic fiber (e.g., KEVLAR®), or any other flexible material. In one embodiment, the access door 604 may be selectively openable and closable. When open, access door 604 provides an opening preferably of sufficient size to permit access to the interior of frame(s) 11 (e.g., through a library door, an I/O station door, a service panel, etc.). Furthermore, access door 604 may be configured as a hinged flap, a zippered door, one or more vertically-hanging slats or flaps, an air curtain, or any other appropriate closure capable of allowing selective access, yet allowing closure in order to provide a barrier between the environment within enclosure 602 and the environment outside the enclosure 602.

When access door 604 is closed, enclosure 602 may form a sleeve around library frame(s) 11 such that the environmental conditions within enclosure 602 are substantially separate from and different than the environmental conditions outside the enclosure 602. An environmental conditioning unit 606, located outside of and separate from enclosure 602, may be fluidly connected to the enclosure 602 via at least one duct 608. The environmental conditioning unit 606 may operate to provide conditioned air into the interior of the enclosure 602, thereby controlling the at least one environmental condition (e.g., temperature and/or humidity) within the enclosure 602. The environmental conditioning unit 606 may be any suitable mechanism to condition the air, which may comprise cooling, heating, removing humidity, adding humidity, filtering, or any other modification to the ambient air. Additionally and/or alternatively, the inlet port of duct 608 into enclosure 602 may be strategically placed so as correspond to one or more fan or vent inlets (or outlets) on frame(s) 11 so as to allow the conditioned air provided from environmental conditioning unit 602 to enter into the library frame(s) 11. With no separate return path for the conditioned air being provided, positive air pressure would result within enclosure 602 when environmental conditioning unit 606 is active, forcing conditioned air into enclosure 602 and out of any existing gaps, cracks, openings, vents, etc. in enclosure 602. A vent, hole, opening, etc. may be strategically placed so as correspond to one or more fan or vent or outlets on frame(s) 11 so as to allow the conditioned air provided from environmental conditioning unit 602 to exit the library frame(s) 11. Alternatively, a return air duct (not shown) may be provided and, if present, may be strategically placed so as to correspond to one or more fan or vent outlets (or inlets) on frame(s) 11 so as to allow the conditioned air provided from environmental conditioning unit 602 to exit from the library frame(s) 11.

Additionally, one or more environmental sensors 610 may be located within enclosure 602 such that the controller of the environmental conditioning unit 606 (or another control system, such as library controller 400) may maintain or substantially maintain one or more set, selected and/or desired environmental conditions within enclosure 602. The environmental sensor(s) 610 may be, for example, temperature and/or humidity sensors. Additionally, while not shown, library frame(s) 11 may also incorporate one or more environmental sensors therein for the same purpose as that described above. The environmental sensor(s) 610 may communicate with the environmental conditioning unit 606 or other controller via any suitable connection means, such as a wired connection or wireless connection. Also, while shown as being located on an interior wall of enclosure 602, it is to be understood that environmental sensor(s) 610 may be provided at any suitable location(s) within enclosure 602 (which may also comprise a location within frame 11).

Figure 8:
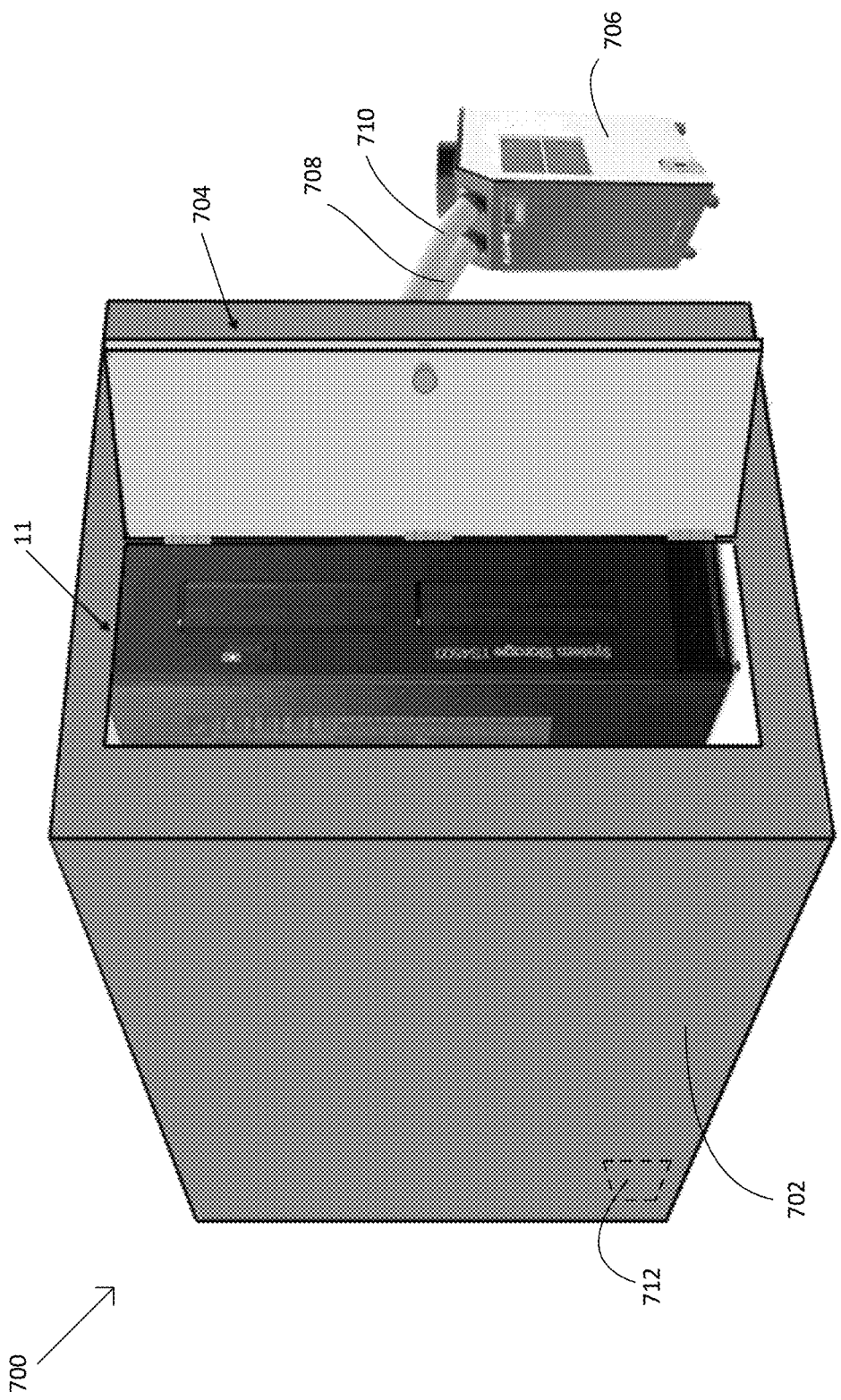
FIG. 8 is a perspective view of an environmental conditioning system for a data storage library in accordance with another aspect.

Referring to FIG. 8, another embodiment of an environmental conditioning system is disclosed. Environmental conditioning system 700, like environmental conditioning system 500 described above, comprises an enclosure 702 at least partially surrounding a data storage library frame(s) 11. While FIG. 8 only shows library frame 11 comprising a single library frame, it is to be understood that the data storage library may comprise a plurality of frames, such as that which is illustrated in FIG. 3. Library frame(s) 11 may comprise conventional data storage library componentry, similar to that which is found in library 10 described above with respect to FIG. 2. For instance, one or more of library frames 11 may comprise a plurality of storage slots to hold data storage cartridges associated with data storage media, one or more data storage drives to read and/or write data associated with the media associated with the data storage cartridges, and one or more robotic accessors.

Environmental conditioning system 700 comprises an enclosure 702 adapted and configured to substantially and/or entirely surround the data storage library frame(s) 11 and preferably permits access to the data storage library in a manner that resists, inhibits, and/or prevents environmental conditions outside the enclosure from intruding and/or infiltrating into the interior chamber formed by the enclosure. In one embodiment enclosure 702 may provide and substantially maintain stable environmental conditions within the enclosure 702.

Enclosure 702 may be formed of any rigid structural material, preferably a material such as, for example, wood, plastic, carbon fiber, metal, etc. Additionally and/or alternatively, enclosure 702 may comprise multiple layers of multiple materials, either alike or different, so as to provide varying degrees of insulating properties, if needed. One or more layers of material of enclosure 702 may be an insulation layer. Furthermore, at least a portion of enclosure 702 may be formed of a substantially water-resistant or waterproof material. Enclosure 702 may be constructed around library frame(s) 11 so as to be either a portable, semi-permanent or permanent structure. The material preferably provides a barrier to environmental conditions, for example, temperature and/or humidity. In one embodiment, the enclosure 702 is capable of providing and/or maintaining relatively stable environmental conditions within enclosure 702.

At least one access door 704 may be provided on at least one side wall of enclosure 702 so as to allow selective access by an operator into the interior chamber formed by enclosure 702. Access door 704 may be a hinged door constructed of the same or similar materials as the enclosure 702, such as, for example, wood, plastic, carbon fiber, metal, etc. Alternatively, access door 704 may be made of a different, non-rigid material, such as nylon, polyester, canvas, cotton, silk, plastic, foil, a para-aramid synthetic fiber (e.g., KEVLAR®), or any other flexible material. Door 704 may comprise a flap, a zippered door, hanging slats or flaps (similar to a vertical blind), an air curtain, or any entryway barrier that will provide some degree of environmental control when not being accessed. Door 704 preferably permits ingress and egress from the enclosure 702 and may be selectively openable and closable.

When access door 704 is closed, enclosure 702 may form a chamber having environmental conditions around library frame(s) 11, that are substantially separate from and different than the environmental conditions outside the enclosure 702. Enclosure 702 may encompass all of the library frame(s) 11, or at least portions of library frame(s) 11. An environmental conditioning unit 706, located outside of and separate from enclosure 702, may be fluidly connected to the enclosure 702 via a supply duct 708 and a return duct 710, wherein supply duct 708 provides conditioned air into enclosure 702, while return duct 710 allows for the recirculation of conditioned air out of enclosure 702. Alternatively, only a single supply duct may be provided, allowing for positive pressure to form within the enclosure 702, as detailed above with respect to FIG. 6.

The environmental conditioning unit 706 may operate to provide conditioned air into the interior of the enclosure 702, thereby controlling at least one environmental condition (e.g., temperature and/or humidity) within the enclosure 702. The environmental conditioning unit 706 may be any suitable mechanism to condition the air, which may comprise cooling, heating, removing humidity, adding humidity, filtering, or any other modification to the ambient air.

Additionally, one or more environmental sensors 712 may be located within enclosure 702 such that the controller of the environmental conditioning unit 706 (or another control system, such as library controller 400) may maintain one or more environmental conditions within enclosure 702. The environmental sensor(s) 712 may be, for example, temperature and/or humidity sensors. Additionally, while not shown, library frame(s) 11 may also incorporate one or more environmental sensors therein for the same purpose as that described above. The environmental sensor(s) 712 may communicate with the environmental conditioning unit 706 or other controller via any suitable connection means, such as a wired connection or wireless connection. Also, while shown as being located on an interior wall of enclosure 702, it is to be understood that environmental sensor(s) 712 may be provided at any suitable location(s) within enclosure 702 (which may also comprise a location within frame 11).

Environmental conditioning unit 706 may be configured to provide conditioned air into enclosure 702 via duct 708 so as to condition the environment within the interior of the enclosure, and library frame(s) 11 as well. In one aspect, one or more fans within frame(s) 11 for tape drives, power supplies, library controllers, etc. may aid in maintaining air circulation within both frame(s) 11 and enclosure 702. Vents and/or natural openings within frame(s) 11 may be configured to allow the conditioned air from within enclosure 702 to enter the interior of the frame(s) 11.

While shown in FIG. 8 as surrounding library frame(s) 11, it is to be understood that enclosure 702 may surround or encompass only certain areas of library frame(s) 11 where air is capable of flowing into or out of the frame(s) 11. For example, the enclosure may only cover an area of the frame(s) 11 where fans are configured to draw air into the interior of the data storage library. In another example, a first enclosure may cover an area of the frame(s) 11 where fans are configured to draw air into the interior of the data storage library, while another enclosure may be configured to cover an area of the frame(s) 11 where vents are located to allow air to pass out of the data storage library. In such an example, the supply duct of the environmental conditioning unit may be fluidly connected to the first enclosure, while a return air duct may be fluidly connected to the second enclosure.

Figure 9:
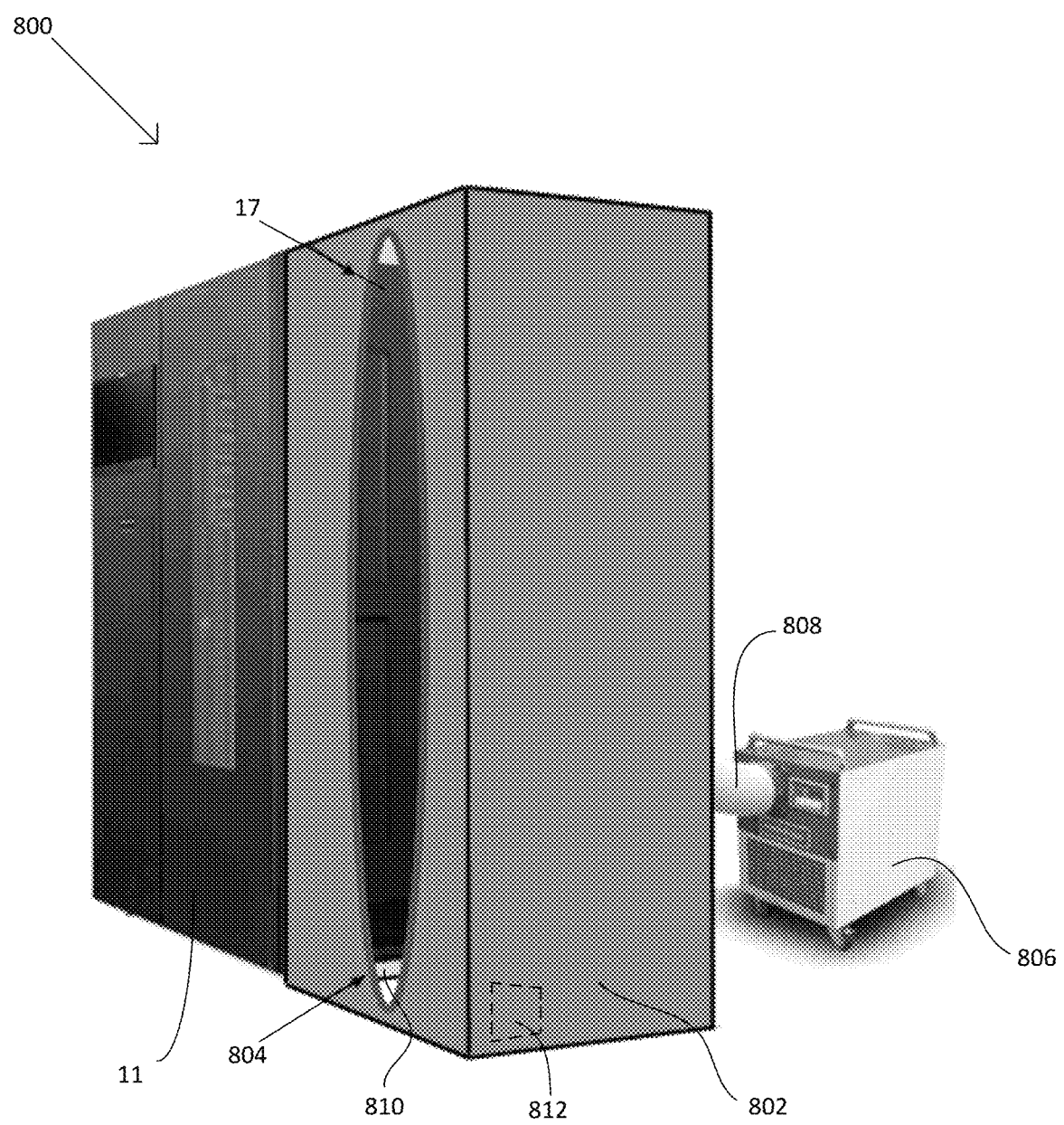
FIG. 9 is a perspective view of an environmental conditioning system for a data storage library in accordance with another aspect.

Next, referring to FIG. 9, an environmental conditioning system 800 according to another aspect of the disclosure is illustrated. System 800 comprises enclosure 802 adapted and configured to substantially or partially surround at least one side of a library frame 11, such as the access door 17 of frame 11. Enclosure 802 may include a plurality of side and/or top panels, as well as an access door 804. Access door 804 may be configured as a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high-traffic cold storage room), a split membrane (e.g., a flexible slot or hole that remains closed until forced open), an air curtain (e.g., a high-traffic store front that uses a wall of forced air to create an environmental barrier), a sliding panel (e.g., a sliding closet door, a pocket door, etc.), a rolled door (e.g., rolling blinds, rolled security door, etc.), or any other appropriate closure capable of allowing selective access, yet allowing closure in order to provide a barrier between the environment within enclosure 802 and the environment outside the enclosure 802. Access door 804 may be formed of any suitable material, such as, for example, nylon, polyester, canvas, cotton, silk, plastic, foil, a para-aramid synthetic fiber (e.g., KEVLAR®), or any other flexible material. Alternatively, there may be no door 804 incorporated into enclosure 802. Enclosure 802 may also include a skirt 810, with skirt 810 capable of providing a barrier and/or seal between the bottom portion of library frame(s) 11 and the floor or other surface upon which library frame(s) 11 stand.

Enclosure 802 may have the capability of being easily and quickly erected and/or installed (and/or uninstalled and/or collapsed) to substantially surround at least one side of the one or more library frames 11. The walls of enclosure 802 may be self-supporting, or may be held by a collapsible and/or removable framework structure (not shown). The framework structure may be formed of any appropriate material, such as, for example, a plurality of fiberglass or para-aramid synthetic fiber (e.g., KEVLAR®) poles. The framework structure may be broken down so as to enable the enclosure 802 to be portable and storable when not in use. Additionally, the framework structure may comprise a plurality of spring-biased joints and/or flexible members enabling the structure to automatically erect when opened.

Enclosure 802 may be formed of any suitable material, such as nylon, polyester, canvas, cotton, silk, plastic, foil, a para-aramid synthetic fiber (e.g., KEVLAR®), or any other flexible material. Alternatively, enclosure 802 may be formed of a substantially rigid material, such as, for example, wood, plastic, carbon fiber, metal, etc.

When access door 804 is closed, enclosure 802 may form a chamber having controlled environmental conditions around at least one side of library frame(s) 11, wherein the interior environmental conditions are substantially separate from and different than the environmental conditions outside the enclosure 802. An environmental conditioning unit 806, located outside of and separate from enclosure 802, may be fluidly connected to the enclosure 802 via at least one duct 808. The environmental conditioning unit 806 may operate to provide conditioned air into the interior of the enclosure 802, thereby controlling the at least one environmental condition (e.g., temperature and/or humidity) within the enclosure 802. The environmental conditioning unit 806 may be any suitable mechanism to condition the air, which may comprise cooling, heating, removing humidity, adding humidity, filtering, or any other modification to the ambient air.

Unlike the enclosures described above, which substantially surround an entire library frame 11, enclosure 802 need only surround an area of the library frame 11. The enclosure may only surround the area of the library where air is drawn into the interior of the library. For example, one or more fans or vents (not shown) in library frame 11 may be located in or adjacent access door 17, which is substantially surrounded by enclosure 802. Thus, air drawn into the library frame 11 is actually conditioned air provided by environmental conditioning unit 806, as opposed to the ambient external air surrounding other portions of the frame 11. In this way, the interior of library frame 11 is provided with conditioned air, without the need for an enclosure which entirely surrounds the frame 11.

In accordance with another aspect, a first, primary enclosure may substantially surround an area of the library where vents and/or fans are designed to draw air into the library, while a secondary enclosure may be utilized to substantially surround another area of the library where vents and/or fans are designed to let air pass out of the library. In such a configuration, the one or more supply ducts of the environmental conditioning unit may be fluidly connected to the primary enclosure, while one or more return ducts may be fluidly connected to the secondary enclosure so as to recirculate the conditioned air. Furthermore, in the event that a top or bottom surface of the frame 11 comprises air intake and/or exhaust ports, one or more enclosures could be utilized to cover those intake and/or exhaust ports so as to prevent conditioned air from leaking into the external environment. Alternatively, some ports and/or vents on frame 11 may be blocked rather than providing a separate enclosure so as to move conditioned air into or out of the data storage library.

Additionally, one or more environmental sensors 812 may be located within enclosure 802 such that the controller of the environmental conditioning unit 806 (or another control system, such as library controller 400) may maintain one or more environmental conditions within enclosure 802. The environmental sensor(s) 812 may be, for example, temperature and/or humidity sensors. Additionally, while not shown, library frame(s) 11 may also incorporate one or more environmental sensors therein for the same purpose as that described above. The environmental sensor(s) 812 may communicate with the environmental conditioning unit 806 or other controller via any suitable connection means, such as a wired connection or wireless connection. Also, while shown as being located on an interior wall of enclosure 802, it is to be understood that environmental sensor(s) 812 may be provided at any suitable location(s) within enclosure 802 (which may also comprise a location within frame 11).

Figure 10B:
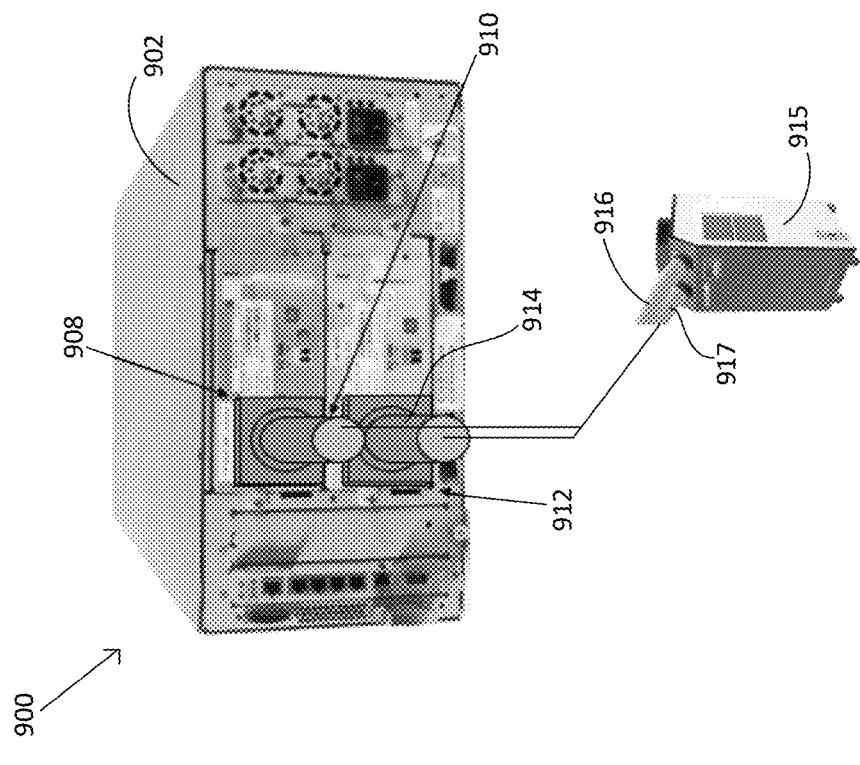
FIG. 10B is a rear view of an environmental conditioning system for the data storage library of FIG. 10A.
Figure 10A:
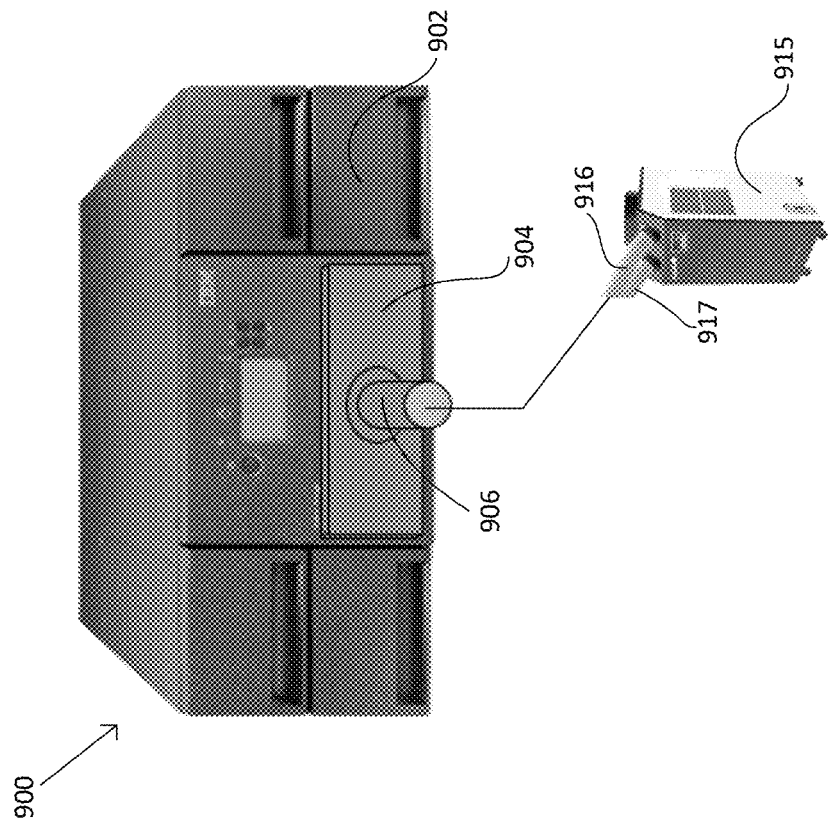
FIG. 10A is a front view of an environmental conditioning system for a data storage library in accordance with another aspect.

Next, referring to FIGS. 10A-10B, an environmental conditioning system 900 according to another aspect of the disclosure is illustrated. While FIGS. 1-9 pertain to data storage library systems comprising one or more large library frames, other data storage scenarios may not necessitate such large-scale storage capabilities. Accordingly, smaller, "desktop"-style automated data storage libraries may be more appropriate for such circumstances. Examples of automated data storage libraries which have a similar configuration as that depicted in FIGS. 10A-10B, and may be implemented with some of the various approaches herein, may include the IBM TS3200 Library and the IBM TS3100 Library.

As shown in FIGS. 10A-10B, environmental conditioning system 900 includes a data storage library 902. While not shown in detail, it is to be understood that the data storage library may comprise all or most components needed for the storage of data on data storage cartridges, including data storage drives, a library controller, etc.

Depending upon the environmental conditions of the room surrounding data storage library 902, it may be advantageous to control the environmental conditions within data storage library 902 for the same reasons as those discussed above with respect to the environmental conditioning systems shown in FIGS. 6-9. For example, referring to FIG. 10A, system 900 may comprise an enclosure 904 mounted on a front portion of data storage library 902. The enclosure 904 may be fluidly connected to a supply duct 916 of an associated environmental conditioning unit 915 via a duct connector 906, which may deliver conditioned air into the enclosure 904 (and the chamber created by enclosure 904) and, thus, into the data storage library 902. Enclosure 904 may be mounted at one or more locations on data storage library 902 where vent holes for exhausting air from and/or drawing air into the interior of the data storage library 902 are located. In this way, conditioned air provided by environmental conditioning unit 915 may be blown into the interior of data storage library 902, thereby regulating the environmental conditions (e.g., temperature and/or humidity) within the data storage library 902.

Referring to FIG. 10B, a rear view of data storage library 902 is shown. In some aspects of the disclosure, system 900 may further include one or more additional enclosures 908, 912, which may be mounted over fan holes located in the rear of data storage library 902, which conventionally serve the purpose of exhausting air from (or drawing air into) the interior of data storage library 902 for ventilation (and the chamber created by enclosure 908 and/or 912). Enclosures 908, 912, on the other hand, may cover the fan holes and may be fluidly coupled (via respective duct connectors 910, 914) to a return duct 917 of environmental conditioning unit 915 so as to recirculate conditioned air provided within data storage library 902. Alternatively, enclosures 908, 912 may be combined into a single enclosure covering one or more fan holes in the rear of data storage library 902. While it may be very small, enclosure 904, 908 and/or 912 comprise a chamber space between the duct connection and data storage library 902.

In the event that the data storage library 902 has fans configured to draw air from the front to the back of the library, enclosure 904 may be configured to supply conditioned air from environmental conditioning unit 915, while enclosures 908, 912 may be configured to return conditioned air for recirculation in environmental conditioning unit 915. Alternatively, if the fans of data storage library 902 are configured to draw air from the back to the front of the library, then enclosures 908, 912 may be configured to supply conditioned air from environmental conditioning unit 915, while enclosure 904 may be configured to return conditioned air for recirculation in environmental conditioning unit 915. Still further, the system 900 may be configured such that there is no return path for conditioned air, and thus there may only be a conditioned air supply (e.g., enclosure 904) which provides conditioned air into the interior of data storage library 902.

As shown in FIG. 10B, the rear of data storage library 902 may comprise fan and/or vent holes in addition to those covered by enclosures 908, 912. Accordingly, one or more additional enclosures may be mounted over the additional fan and/or vent holes. Alternatively, a single enclosure may be configured to cover all fan and/or vent holes (e.g., an enclosure which covers the entire rear surface of data storage library 902). Additionally and/or alternatively, enclosure(s) may not be needed for all fan and/or vent holes, as air loss or leakage through such air holes may be insignificant to the overall environmental conditioning experienced within data storage library 902.

Furthermore, while not shown, it is to be understood that one or more of enclosures 904, 908, 912 may comprise one or more environmental sensors (e.g., temperature and/or humidity sensors). Additionally and/or alternatively, data storage library 902 and/or environmental conditioning unit 915 (and/or the ducting therebetween) may comprise one or more environmental sensors. Such environmental sensors may be utilized in conjunction with a library controller (or other suitable controller, e.g. environmental conditioning unit controller) so as to maintain desired environmental conditions within data storage library 902, and the sensor(s) may communicate with the controller through a wired connection, a wireless connection, or combinations thereof.

Figure 11B:
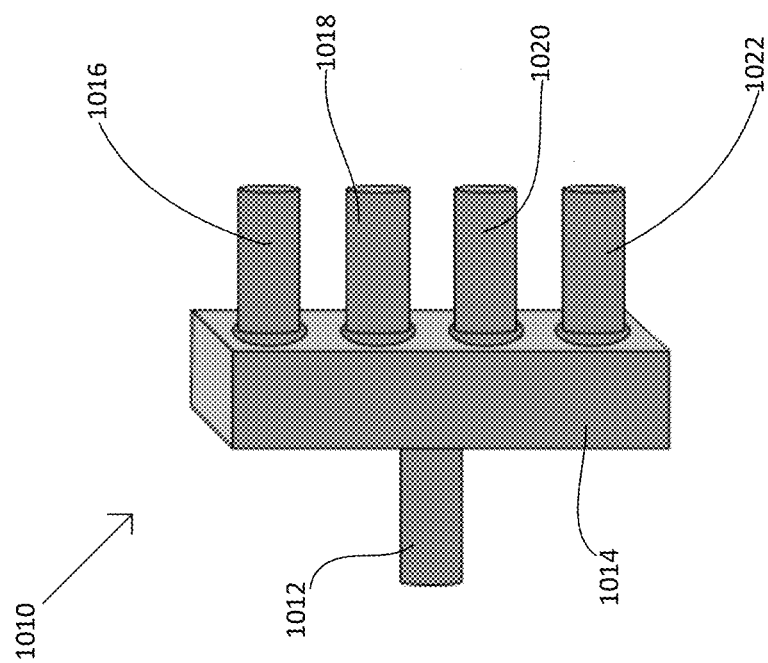
FIG. 11B is a side view of a multi-port manifold in accordance with another aspect.
Figure 11A:
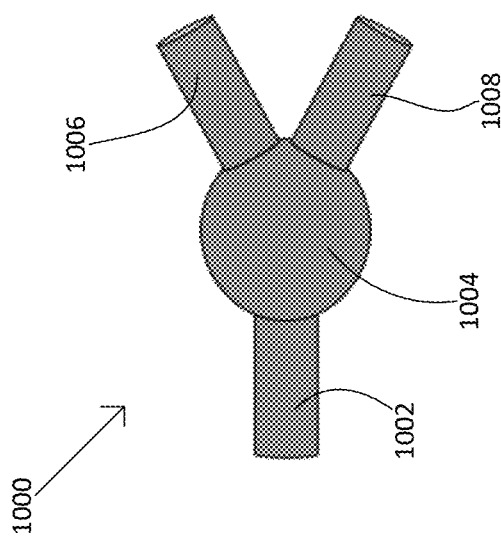
FIG. 11A is a side view of a Y-duct in accordance with one aspect.

Referring to FIG. 11A, a Y-duct 1000 for splitting a single duct into two separate ducts is illustrated. Y-duct 1000 may include a primary port 1002, a connector 1004, and two secondary ports 1006, 1008. In this way, primary port 1002 may be fluidly connected to an environmental conditioning unit so as to enable conditioned air to flow through each of secondary ports 1006, 1008. As such, the conditioned air from a single environmental conditioning unit may flow to two different data storage libraries/enclosures, or to two different areas of the same data storage library/enclosure. Alternatively and/or additionally, the return air supply from two different data storage libraries/enclosures or two different areas of the same data storage library/enclosure may be routed to a single environmental conditioning unit via Y-duct 1000. Furthermore, while not shown, the Y-duct 1000 may include one or more air handling valves therein to allow different degrees of air flow between secondary ports 1006, 1008, thereby allowing for greater control of air flow to two different data storage libraries/enclosures or two different areas of the same data storage library/enclosure by a single environmental conditioning unit.

FIG. 11B, on the other hand, illustrates a manifold 1010. Manifold 1010 includes a primary port 1012, connector 1014, and four separate secondary ports 1016, 1018, 1020, 1022. In this way, manifold 1010 is configured to allow a single environmental conditioning unit to supply conditioned air to multiple data storage libraries/enclosures and/or multiple locations of a single library/enclosure. That is, primary port 1012 may be fluidly connected to an environmental conditioning unit so as to enable conditioned air to flow through each of secondary ports 1016, 1018, 1020, 1022. Alternatively and/or additionally, one or more of secondary ports 1016, 1018, 1020, 1022 may operate as return paths for conditioned air from the respective data storage libraries/enclosures or regions within a single library enclosure. Furthermore, more than one primary port 1012 may be utilized so as to increase the overall air handling capability of manifold 1010. Also, while not shown, the manifold 1010 may include one or more air handling valves therein to allow different degrees of air flow between secondary ports 1016, 1018, 1020, 1022, thereby allowing for greater control of air flow to multiple different data storage libraries/enclosures or multiple different areas of the same data storage library/enclosure by a single environmental conditioning unit fluidly coupled to primary port 1012.

Figure 12:
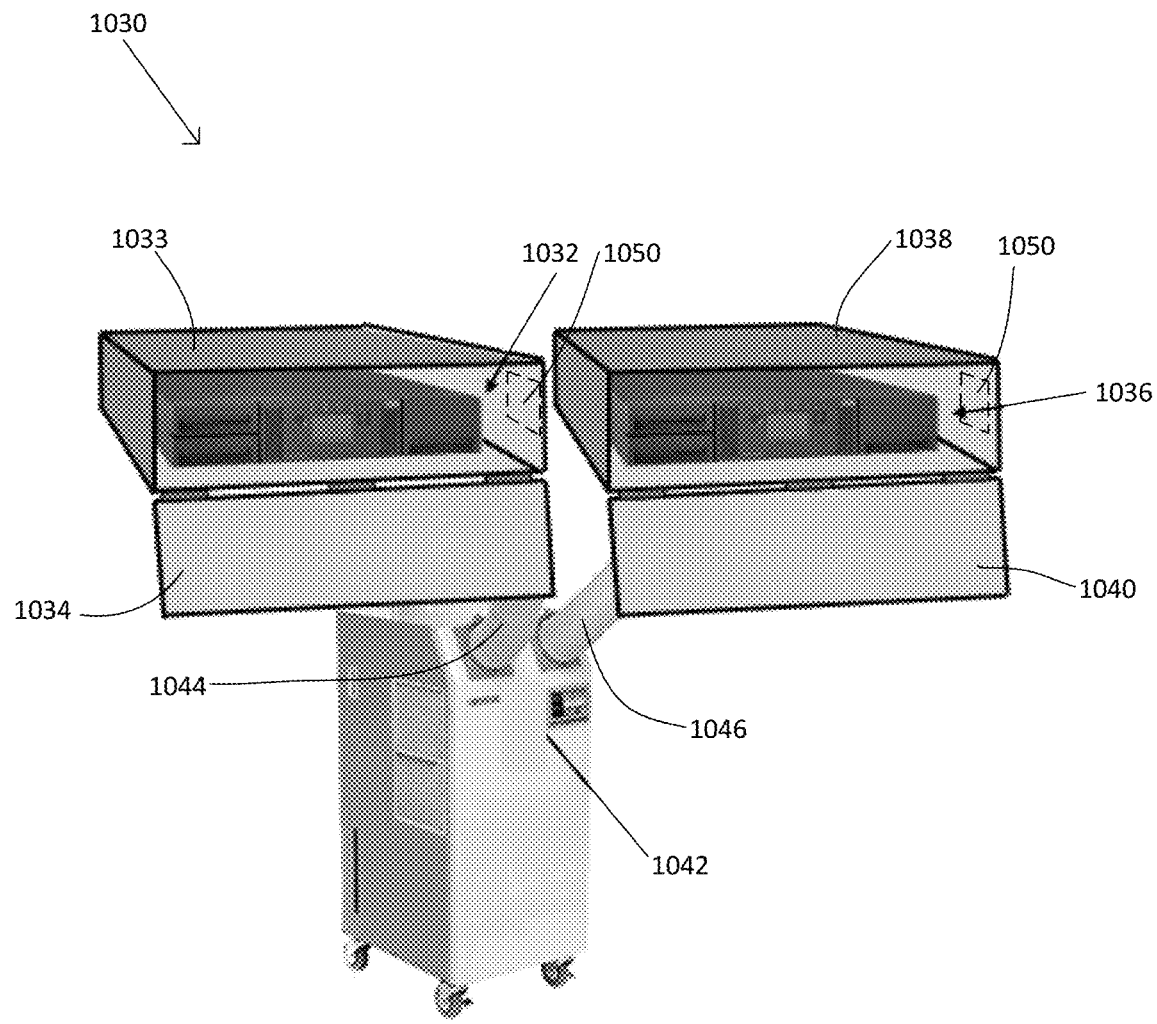
FIG. 12 is a perspective view of an environmental conditioning system for a plurality if data storage libraries in accordance with another aspect.

Next, referring to FIG. 12, an environmental conditioning system 1030 according to another aspect of the disclosure is illustrated. As discussed above with respect to FIGS. 10A-10B, "desktop"-style data storage libraries are often utilized for smaller scale data storage needs, and such smaller data storage libraries may also benefit from controlled environmental conditions therein. Additionally, a plurality of smaller data storage libraries are often used in tandem, dependent upon the user's specific data storage needs. Accordingly, environmental conditioning system 1030 includes a first data storage library 1032 at least partially surrounded by a first enclosure 1033, as well as a second data storage library 1036 at least partially surrounded by a second enclosure 1038. A single environmental conditioning unit 1042 may be configured to supply conditioned air to first enclosure 1033 via a first supply duct 1044 and supply conditioned air to second enclosure 1038 via a second supply duct 1046. Alternatively, while not shown, environmental conditioning unit 1042 may include one or more supply ducts and one or more return ducts for recycling conditioned air provided to the enclosures, which may conserve energy and/or provide improved environmental control of the conditioned air.

First enclosure 1033 may comprise an enclosure door 1034, while second enclosure 1038 may comprise an enclosure door 1040. Enclosure doors 1034, 1040 may allow for access to various portion of respective data storage libraries 1032, 1036, such as removable data storage drives, removable data storage cartridges, an operator interface panel, etc. Also, while not shown, first enclosure 1033 and/or second enclosure 1038 may include a rear enclosure door to enable access to data storage drives, power supplies, library controllers, etc. When enclosure doors 1034, 1040 are closed, the environmental conditions within respective enclosures 1033, 1038 may be regulated and/or controlled by conditioned air provided via the fluid connection to environmental conditioning unit 1042.

Furthermore, first enclosure 1033 and/or second enclosure 1038 may also include one or more environmental sensors 1050 therein. One or more environmental sensors 1050 may enable a controller of the environmental conditioning unit 1042 (or another control system, such as library controller 400) to maintain one or more set environmental conditions within respective enclosures 1033, 1038. The environmental sensor(s) 1050 may be, for example, temperature and/or humidity sensors. Additionally, while not shown, libraries 1032, 1036 may also incorporate one or more environmental sensors therein for the same purpose as that described above. The environmental sensor(s) 1050 may communicate with the environmental conditioning unit 1042 or other controller via any suitable connection means, such as a wired connection or wireless connection. Also, while shown as being located on an interior wall of enclosures 1033, 1038, it is to be understood that environmental sensor(s) 1050 may be provided at any suitable location(s) within enclosures 1033, 1038.

Also, while not shown in FIG. 12, it is to be understood that a single supply duct may provide conditioned air (or receive return air) for more than one enclosure by using, for example, one or more interconnected ducts such as the Y-duct shown and described above with respect to FIG. 11A, or the manifold shown and described above with respect to FIG. 11B. Also, while not shown, the Y-duct and/or manifold may include one or more air handling valves therein to allow different degrees of air flow between neighboring ducts, thereby allowing for greater control of air flow to multiple different data storage libraries/enclosures or multiple different areas of the same data storage library/enclosure by a single environmental conditioning unit.

Figure 13:
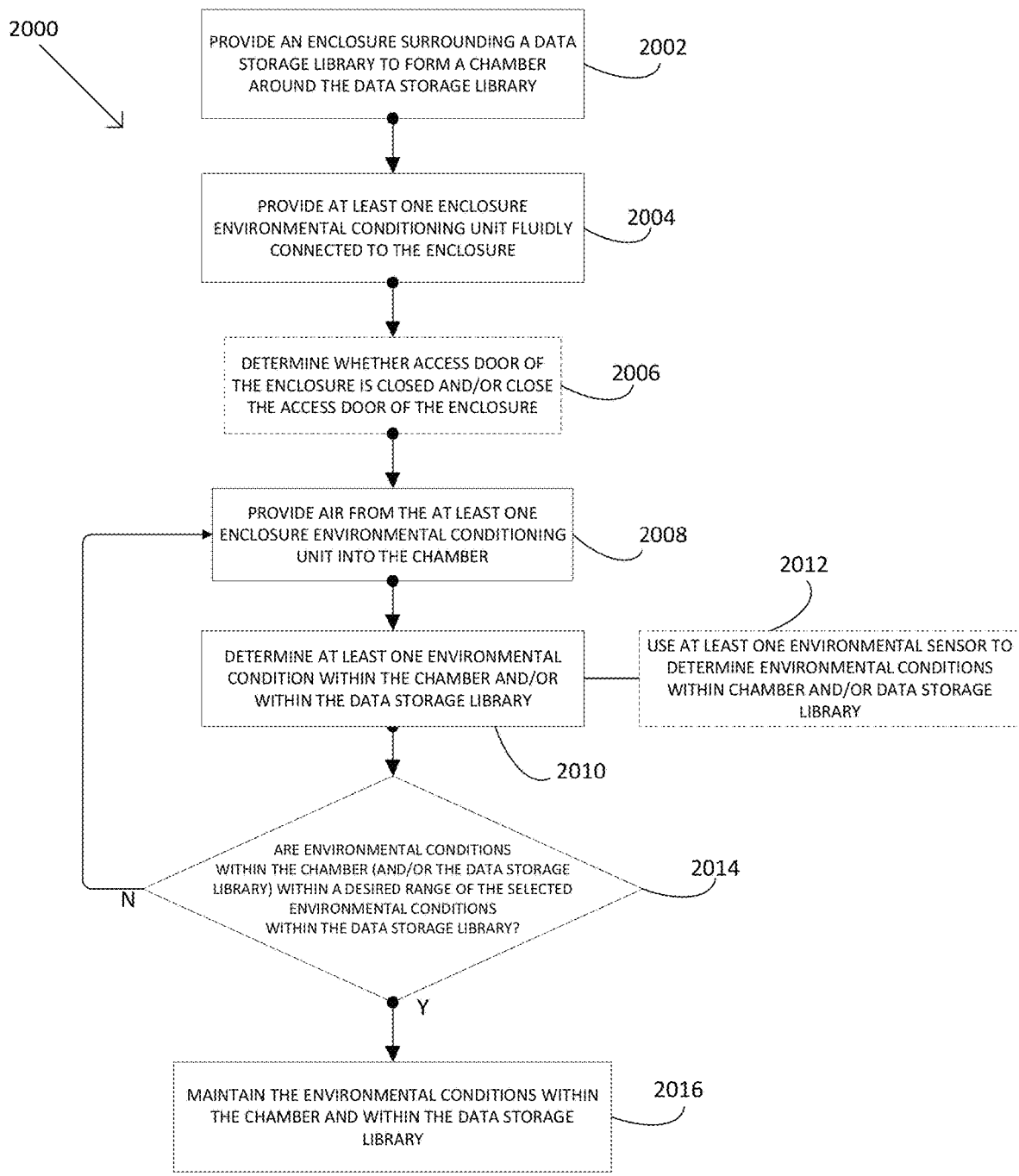
FIG. 13 is a flowchart of a method of providing environmentally controlled air into a data storage library in accordance with one aspect.

Next, referring to FIG. 13, a process 2000 for providing environmentally conditioned air into a data storage library according to one embodiment is disclosed. While process 2000 may be considered for the sake of convenience and not with the intent of limiting the disclosure as comprising a series and/or number of steps, it is to be understood that the process does not need be performed as a series of steps and/or the steps do not need to be performed in the order shown and described with respect to FIG. 13, but may be performed as an integral process or a series of steps, in the order described or an alternative order. At 2002, an enclosure is provided to substantially surround a data storage library so as to form a chamber around the data storage library. As detailed above, the enclosure may have one or more access doors to allow for access into and out of the enclosure and/or data storage library. At 2004, at least one enclosure environmental conditioning unit (separate from the data storage library) may be provided and fluidly connected to the enclosure via, for example, at least one supply duct and/or at least one return duct. At 2006, it may be determined whether or not the access door of the enclosure is closed and, if not closed, the access door of the enclosure may be closed, either automatically or manually. This step may be optional because, for example, there may not be an access door of the enclosure or the access door may not require closing (e.g., as with hanging slots or an air curtain).

At 2008, air from the at least one enclosure environmental conditioning unit is provided into the chamber formed by the enclosure. The air preferably not only conditions the chamber, but also conditions the environment within the interior of the data storage library via, for example, at least one ventilation opening in the data storage library. At 2010, at least one environmental condition (e.g., temperature and/or humidity) within the chamber and/or within the data storage library is determined. Such a determination may be made, for example, by using at least one environmental sensor (e.g., temperature and/or humidity sensors) at 2012. The sensor may be positioned within the chamber of the enclosure and/or within the data storage library.

Next, at 2014, it is determined whether the environmental conditions within the chamber are within a desired range of selected environmental conditions within the data storage library. The selected environmental conditions within the data storage library may be predetermined based on known desirable operational conditions, or may be calculated based on exterior conditions, operational status of the data storage library, etc. If the environmental conditions are not within the desired range of selected environmental conditions within the data storage library, conditioned air from the at least one enclosure may continue to be provided into the chamber. However, if yes, then the environmental conditions within the chamber and within the data storage library may be maintained at 2016. Such maintenance of the environmental conditions within the chamber and data storage library may include shutting down the enclosure environmental conditioning unit when the selected environmental conditions are reached, and/or selectively and intermittently operating the enclosure environmental conditioning unit so as to maintain the selected environmental conditions.

Figure 14:
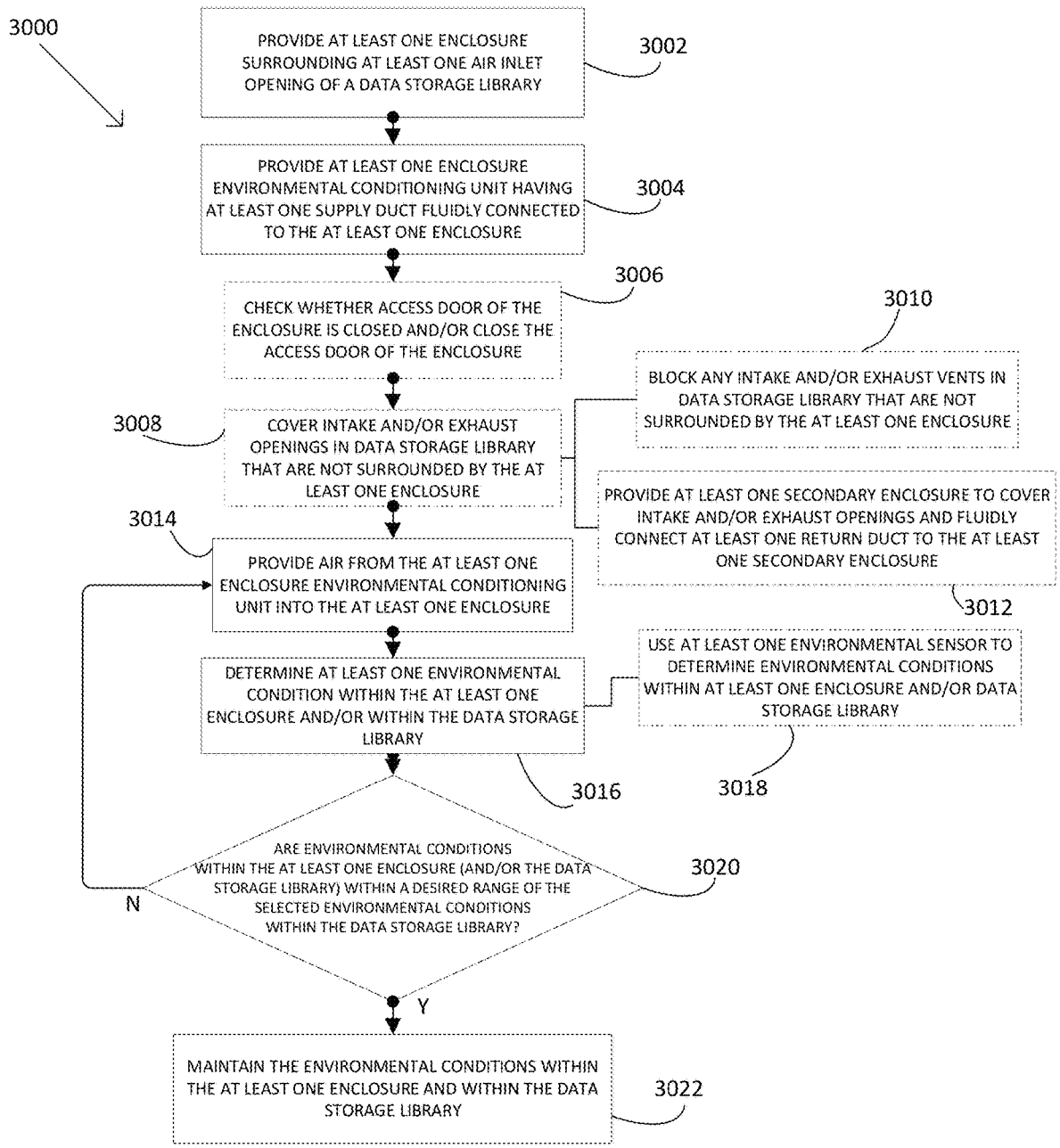
FIG. 14 is a flowchart of a method of providing environmentally controlled air into a data storage library in accordance with another aspect.

Referring now to FIG. 14, a process 3000 for providing environmentally conditioned air into a data storage library according to another embodiment is disclosed. While process 3000 may be considered for the sake of convenience and not with the intent of limiting the disclosure as comprising a series and/or number of steps, it is to be understood that the process does not need be performed as a series of steps and/or the steps do not need to be performed in the order shown and described with respect to FIG. 14, but may be performed as an integral process or a series of steps, in the order described or an alternative order. At 3002, at least one enclosure is provided to substantially surround at least one air inlet opening of a data storage library so as to form a chamber or barrier around the at least one air inlet opening. As detailed above, the at least one enclosure may have one or more access doors to allow for access into and out of the enclosure and/or data storage library. Alternatively, the enclosure may have no access door(s). At 3004, at least one enclosure environmental conditioning unit (separate from the data storage library) may be provided and fluidly connected to the at least one enclosure via, for example, at least one supply duct. At 3006, it may be determined whether or not the access door of the enclosure (if present) is closed and, if not closed, the access door of the enclosure may be closed, either automatically or manually.

Next, at 3008, any intake and/or exhaust openings in the data storage library that are not surrounded by the at least one enclosure optionally may be covered. For example, any intake and/or exhaust vents in the data storage library that are not surrounded by the at least one enclosure may be physically blocked at 3010. Alternatively, and/or additionally, at least one secondary enclosure may be provided to cover the intake and/or exhaust vents or openings, and the at least one secondary enclosure may be fluidly connected to at least one return duct of the enclosure environmental conditioning unit at 3012.

At 3014, air from the at least one enclosure environmental conditioning unit is provided into the at least one enclosure. The air preferably not only conditions the enclosure, but also conditions the environment within the interior of the data storage library via, for example, one or more ventilation openings in the data storage library. At 3016, at least one environmental condition (e.g., temperature and/or humidity) within the at least one enclosure and/or within the data storage library is determined. Such a determination may be made, for example, by using at least one environmental sensor (e.g., temperature and/or humidity sensors) within the at least one enclosure and/or the data storage library at 3018.

At 3020, it is determined whether the environmental conditions within the at least one enclosure and/or within the data storage library are within a desired range of the selected environmental conditions within the data storage library. The selected environmental conditions within the data storage library may be predetermined based on known desirable operational conditions, or may be calculated based on exterior conditions, operational status of the data storage library, etc. If the environmental conditions within the data storage library are not within the desired and/or selected range, conditioned air from the environmental conditioning unit may continue to be provided into the at least one enclosure. However, if yes, then the environmental conditions within the at least one enclosure and within the data storage library may be maintained at 3022. Such maintenance of the environmental conditions within the at least one enclosure and/or data storage library may include shutting down the enclosure environmental conditioning unit when the selected environmental conditions are reached, and/or selectively and intermittently operating the enclosure environmental conditioning unit so as to maintain the selected environmental conditions.

Figure 15:
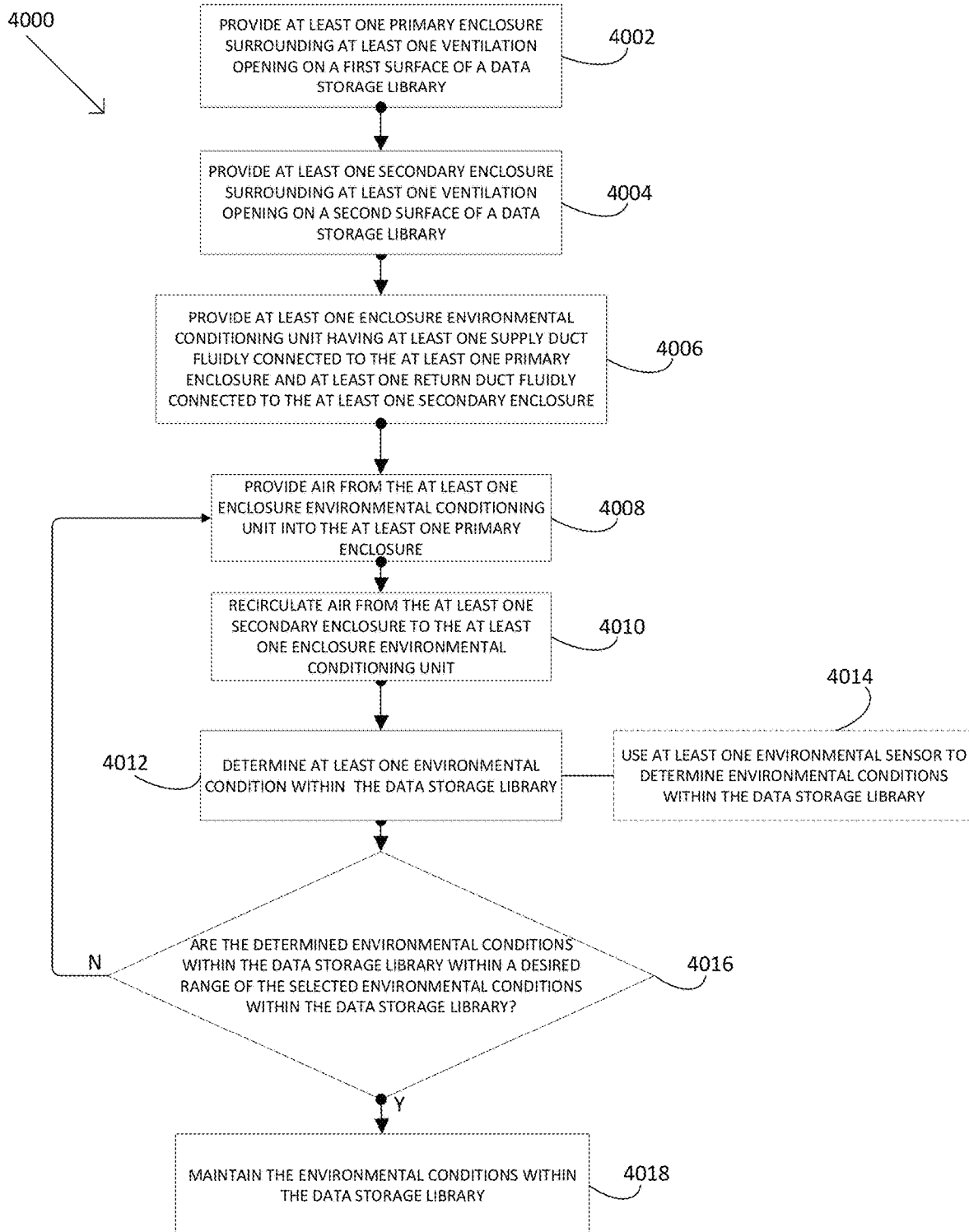
FIG. 15 a flowchart of a method of providing environmentally controlled air into a data storage library in accordance with another aspect.

Referring now to FIG. 15, a process 4000 for providing environmentally conditioned air into a data storage library according to another embodiment is disclosed. While process 4000 may be considered for the sake of convenience and not with the intent of limiting the disclosure as comprising a series and/or number of steps, it is to be understood that the process does not need be performed as a series of steps and/or the steps do not need to be performed in the order shown and described with respect to FIG. 15, but may be performed as an integral process or a series of steps, in the order described or an alternative order. At 4002, at least one primary enclosure is provided to substantially surround at least one ventilation opening on a first surface of a data storage library. At 4004, at least one secondary enclosure is provided to substantially surround at least one ventilation opening on a second surface of the data storage library. At 4006, at least one enclosure environmental conditioning unit (separate from the data storage library) may be provided and fluidly connected to the at least one primary enclosure via, for example, at least one supply duct, as well as fluidly connected to the at least one secondary enclosure via, for example, at least one return duct.

At 4008, air from the at least one enclosure environmental conditioning unit is provided into the at least one primary enclosure. The air from the enclosure environmental conditioning unit not only conditions the primary enclosure, but also conditions the environment within the interior of the data storage library. At 4010, conditioned air from within the data storage library may be recirculated from the at least one secondary enclosure via the at least one return duct. At 4012, at least one environmental condition (e.g., temperature and/or humidity) within the data storage library is determined. Such a determination may be made, for example, by using at least one environmental sensor (e.g., temperature and/or humidity sensors) within the data storage library and/or the primary and/or secondary enclosure at 4014.

At 4016, it is determined whether the environmental conditions within the data storage library are within a desired and/or selected range. The selected environmental conditions within the data storage library may be predetermined based on known desirable operational conditions, or may be calculated based on exterior conditions, operational status of the data storage library, etc. If no, and the environmental conditions within the data storage library are not within the selected range, conditioned air from the at least one enclosure may continue to be provided into the at least one primary enclosure. However, if yes, then the environmental conditions within the data storage library may be maintained at 4018. Such maintenance of the environmental conditions within the data storage library may include shutting down the enclosure environmental conditioning unit when the desired environmental conditions are reached, and/or selectively and intermittently operating the enclosure environmental conditioning unit so as to maintain the selected environmental conditions. Steps 4004, 4010 and the second enclosure and return duct of 4006 may be optional, as there may not be recirculation and/or a return duct for the enclosure environmental conditioning unit. For example, the enclosure environmental conditioning unit may be configured to provide positive pressure of conditioned air to the data storage library without any recirculation.

It follows that various embodiments described and/or suggested herein are able to provide data storage systems, and optionally, automated data storage libraries having environmental control capabilities associated with the automated data storage library, with the capability of operating within desired and/or selected environmental conditions, even without library-mounted environmental conditioning unit(s), which may require modifications to an existing data storage library. As a result, favorable conditions (e.g., temperature, humidity, absence of contaminants, etc.) may be maintained for the data storage drives, data storage cartridges, data storage media, and other library components within the data storage library. Furthermore, the enclosure or enclosures and enclosure environmental conditioning unit(s) may be temporary, semi-permanent, or permanent structures, depending upon the application and user needs. As such, the enclosure(s) and environmental conditioning unit(s) may be utilized on various makes, models, and sizes of data storage libraries.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

A data processing system suitable for storing and/or executing program code may include at least one processor, which may be or be part of a controller, coupled directly or indirectly to memory elements through a system bus, such as controller 400 of FIG. 5. The memory elements can include local memory employed during actual execution of the program code, such as nonvolatile memory 404 of FIG. 5, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a data storage library having a frame that encloses the contents of the data storage library, the frame having a service opening for servicing the data storage library;
   at least one enclosure forming a chamber to permit a person to service the data storage library, the enclosure separate from the data storage library frame and partially surrounding a portion of the data storage library frame that contains the service opening;
   at least one environmental conditioning unit external of the enclosure; and
   at least one duct fluidly connecting the at least one environmental conditioning unit to the enclosure,
   wherein the at least one environmental conditioning unit is configurable to control at least one environmental condition within the at least one enclosure and within the data storage library.

2. The system of claim 1, wherein the at least one enclosure is formed of at least one flexible material, the at least one flexible material selected from the group consisting of nylon, polyester, canvas, cotton, silk, plastic, foil, para-aramid synthetic fiber, and combinations thereof.

3. The system of claim 1, wherein the at least one enclosure is formed of at least one rigid material, the at least one rigid material selected from the group consisting of wood, plastic, carbon fiber, metal, and combinations thereof.

4. The system of claim 1, wherein the at least one enclosure further comprises at least one access opening to permit access to the interior of the at least one enclosure.

5. The system of claim 4, wherein the at least one access opening has an access door to impede intrusion of exterior environmental conditions into the enclosure and escape of interior environmental conditions from the enclosure.

6. The system of claim 1, wherein the at least one enclosure is configured and sized to enclose only one side of the library and to enclose at least one access opening of the data storage library.

7. The system of claim 1, wherein the at least one enclosure further comprises at least one environmental sensor, the at least one environmental sensor configured to sense at least one environmental condition within the at least one enclosure.

8. The system of claim 1, wherein the data storage library comprises at least one opening formed therein, wherein the at least one opening is configured to draw exterior air into the interior of the data storage library.

9. The system of claim 1, wherein the at least one duct comprises only a supply duct configured to supply air from the environmental conditioning unit to the at least one enclosure.

10. The system of claim 1, wherein the environmental conditioning unit comprises at least one of a group consisting of an air conditioning unit and a dehumidifier.

11. The system of claim 2, wherein the enclosure further comprises a collapsible frame structure covered by the flexible material.

12. The system of claim 1, the enclosure further comprising at least one environmental sensor for measuring at least one of temperature, humidity, and combinations thereof.

13. The system of claim 5, wherein the at least one enclosure access door comprises at least one of a group consisting of a hinged door, split membrane, sliding panel, rolled door, hinged flap, a zippered door, vertically-hanging slats, an air curtain, and vertically-hanging flaps.

14. A device, the device comprising:
   an enclosure forming a chamber of sufficient size to contain a person, the enclosure configured to partially surround a portion of a data storage library, the enclosure comprising:
   at least one surface configured to resist the intrusion of exterior environmental conditions into the enclosure chamber, the at least one surface configured to surround at least one service opening in the data storage library;
   at least one access opening in the at least one surface of sufficient size to permit a person to access the chamber;
   at least one access door to impede intrusion of exterior environmental conditions through the at least one access opening into an interior of the enclosure and to impede escape of interior environmental conditions through the at least one access opening;
   at least one enclosure service opening in the at least one surface configured to permit access to the at least one data storage library service opening from the chamber of the enclosure; and
   at least one duct connection configured to fluidly connect at least one duct from an external environmental conditioning unit to the enclosure, where the environmental conditioning unit is separate from the enclosure.

15. The device of claim 14, wherein the at least one surface of the enclosure is flexible, the at least one surface selected from the group consisting of nylon, polyester, canvas, cotton, silk, plastic, foil, para-aramid synthetic fiber, and combinations thereof.

16. The device of claim 15, wherein the enclosure further comprises a collapsible frame structure to support the flexible at least one surface.

17. The device of claim 14, wherein the at least one surface of the enclosure is formed of at least one rigid material selected from the group consisting of wood, plastic, carbon fiber, metal, and combinations thereof.

18. The device of claim 14, the interior of the enclosure further comprising at least one environmental sensor for measuring at least one of temperature, humidity, and combinations thereof.

19. The device of claim 14, wherein the at least one enclosure access door comprises at least one of a hinged door, split membrane, sliding panel, rolled door, hinged flap, a zippered door, vertically-hanging slats, an air curtain, and vertically-hanging flaps.

20. The device of claim 14, wherein the environmental conditioning unit comprises at least one of the group consisting of an air conditioning unit and a dehumidifier.

21. The device of claim 14, wherein the at least one enclosure is configured and sized to enclose only one side of the library and to enclose the at least one service opening of the data storage library.

22. The device of claim 14, wherein the at least one duct comprises only a supply duct configured to supply air from the environmental conditioning unit to the at least one enclosure.

23. A system comprising:
at least one data storage library having at least one data storage library service opening therein;
at least one enclosure configured to only partially surround the data storage library, the at least one enclosure configured to surround the at least one data storage library service opening and to form a chamber of sufficient size to contain a person to service the data storage library, the enclosure having at least one surface configured to resist intrusion of exterior environmental conditions into the enclosure chamber, the at least one surface configured to surround the data storage library service opening and have at least one enclosure service opening to permit access to the data storage library service opening from within the chamber of the enclosure, wherein the at least one enclosure further comprises at least one exterior opening to permit a user to access the chamber of the at least one enclosure, the enclosure further comprising an exterior door to impede intrusion of exterior environmental conditions through the at least one exterior opening into the chamber of the enclosure and to impede escape of interior environmental conditions through the at least one exterior opening, wherein the at least one enclosure access door comprises at least one of a group consisting of a hinged door, split membrane, sliding panel, rolled door, hinged flap, a zippered door, vertically-hanging slats, an air curtain, vertically-hanging flaps and combinations thereof; and
at least one external environmental conditioning unit separate from and fluidly connected to the at least one enclosure, wherein the at least one environmental conditioning unit is one of an air conditioning unit or a dehumidifier configurable to control one or more environmental conditions within the enclosure.

24. The system of claim 23, wherein the at least one surface of the enclosure is flexible, and the enclosure further comprises a collapsible, flexible frame structure to support the flexible at least one surface, wherein the flexible at least one surface is selected from the group consisting of nylon, polyester, canvas, cotton, silk, plastic, foil, para-aramid synthetic fiber, and combinations thereof, and is configured to cover the collapsible, flexible frame.

25. The system of claim 23, wherein the at least one enclosure further comprises at least one enclosure service door to impede intrusion of exterior environmental conditions through the at least one enclosure service opening into the chamber of the enclosure and to impede escape of interior environmental conditions through the at least one enclosure service opening, wherein the at least one enclosure service door comprises at least one of a group consisting of a hinged door, split membrane, sliding panel, rolled door, hinged flap, a zippered door, vertically-hanging slats, an air curtain, vertically-hanging flaps and combinations thereof.

* * * * *